(12) United States Patent
Brooks et al.

(10) Patent No.: US 7,469,838 B2
(45) Date of Patent: Dec. 30, 2008

(54) DETECTABLE COMPONENTS AND DETECTION APPARATUS FOR DETECTING SUCH COMPONENTS

(75) Inventors: Colin Philip Brooks, Wokingham (GB); David Bernard Mapleston, Highworth (GB); Peter Robert Symons, Wokingham (GB); Andrew David White, Wokingham (GB)

(73) Assignee: Brewster Kaleidoscope LLC, Los Altos, CA (US)

( * ) Notice: Subject to any disclaimer, the term of this patent is extended or adjusted under 35 U.S.C. 154(b) by 107 days.

(21) Appl. No.: 10/863,513

(22) Filed: Jun. 9, 2004

(65) Prior Publication Data

US 2005/0033544 A1    Feb. 10, 2005

Related U.S. Application Data

(63) Continuation of application No. PCT/GB02/05583, filed on Dec. 10, 2002.

(30) Foreign Application Priority Data

Dec. 10, 2001  (GB)  ................................ 0129492.5
Oct. 21, 2002  (GB)  ................................ 0224431.7

(51) Int. Cl.
*G06K 19/06* (2006.01)
*G06K 7/08* (2006.01)

(52) U.S. Cl. ...................... 235/493; 235/449; 235/450

(58) Field of Classification Search ................ 235/492, 235/493, 449, 450; 340/572.1, 572.3, 572.4, 340/572.5

See application file for complete search history.

(56) References Cited

U.S. PATENT DOCUMENTS

| 2,974,265 | A |   | 3/1961 | Fritz |
|-----------|---|---|--------|-------|
| 3,197,763 | A |   | 7/1965 | Sterling |
| 3,836,842 | A |   | 9/1974 | Zimmerman et al. |
| 4,008,432 | A |   | 2/1977 | Sugisaki et al. |
| 4,196,359 | A | * | 4/1980 | North et al. ................. 327/108 |
| 4,221,257 | A |   | 9/1980 | Narasimhan |

(Continued)

FOREIGN PATENT DOCUMENTS

DE    3 545647 A1    6/1987

(Continued)

OTHER PUBLICATIONS

Journal of Magnetism and Magnetic Materials, 2003, pp. 33-40, Knobel et al., "Giant Magnetoimpedance: concepts and recent progress".

(Continued)

*Primary Examiner*—Daniel A Hess
(74) *Attorney, Agent, or Firm*—Sterne, Kessler, Goldstein & Fox P.L.L.C.

(57) ABSTRACT

A detectable component has a first inductive coupler (L;M) adapted to couple inductively to a second inductive coupler (L1) of a detection apparatus when the detectable component is in range of or coupled to the detection apparatus. The first inductive coupler has a resistive component (M) with a resistance that varies with magnetic field to cause modulation of a carrier signal supplied to the second inductive coupler of the detection apparatus, the detectable component having a characteristic signature that enables the detectable component to be distinguished by the detection apparatus from other such detectable components having different characteristic signatures.

59 Claims, 15 Drawing Sheets

U.S. PATENT DOCUMENTS

| | | | |
|---|---|---|---|
| 4,268,325 A | | 5/1981 | O'Handley et al. |
| 4,332,848 A | | 6/1982 | Narasimhan |
| 4,646,090 A | | 2/1987 | Mawhinney |
| RE32,427 E | | 5/1987 | Gregor et al. |
| RE32,428 E | | 5/1987 | Gregor et al. |
| 5,191,315 A | | 3/1993 | Cordery et al. |
| 5,552,778 A | | 9/1996 | Schrott et al. |
| 5,812,065 A | | 9/1998 | Schrott et al. |
| 6,121,770 A | | 9/2000 | Sudo |
| 6,165,937 A | * | 12/2000 | Puckett et al. ............... 503/201 |
| 6,255,933 B1 | | 7/2001 | Iwao |
| 6,356,197 B1 | * | 3/2002 | Patterson et al. ......... 340/572.1 |
| 6,784,802 B1 | * | 8/2004 | Stanescu .................... 340/687 |

FOREIGN PATENT DOCUMENTS

| | | | |
|---|---|---|---|
| EP | 0 018237 A | | 10/1980 |
| EP | 0 216584 A2 | | 4/1987 |
| EP | 0 733914 A | | 9/1996 |
| EP | 0 789340 A1 | | 8/1997 |
| EP | 0 793241 A1 | | 9/1997 |
| EP | 0 853245 A | | 7/1998 |
| EP | 0 880035 A | | 11/1998 |
| EP | 0 955616 A | | 11/1999 |
| GB | 2 167627 A | | 5/1986 |
| GB | 2 275207 A | | 8/1998 |
| GB | 2 382957 A | | 6/2003 |
| WO | WO 93/04538 | | 3/1993 |
| WO | WO 97/29463 A | | 8/1997 |
| WO | WO 99/08263 A1 | | 2/1999 |
| WO | WO 99/53458 A1 | | 10/1999 |
| WO | WO 00/42584 A1 | | 7/2000 |
| WO | WO 00/55797 A1 | | 9/2000 |
| WO | WO 01/67085 A1 | | 9/2001 |
| WO | WO 01/75785 | | 10/2001 |
| WO | WO 01/78030 | | 10/2001 |
| WO | WO 01/78030 A | | 10/2001 |

OTHER PUBLICATIONS

International Search Report, dated Jul. 16, 2003, for PCT Patent Application No. PCT/GB02/05583, 7 pages.

International Search Report, dated Nov. 20, 2000, for PCT Patent Application No. PCT/SE00/00680, 3 pages.

International Search Report, dated Aug. 1, 2003, for PCT Application No. PCT/GB02/05591, 5 pages.

Search Report, dated May 30, 2002, for UK Application No. 0129492.5, 1 page.

Search Report, dated Dec. 2, 2002, for UK Application No. 0224431.7, 1 page.

International Search Report, dated Jul. 16, 2003, for PCT Application No. PCT/GB02/05583, 3 pages.

International Search Report, dated Nov. 26, 1992, for PCT Application No. PCT/US92/06643, 3 pages.

International Search Report, dated Oct. 30, 2001, for PCT Application No. PCT/US01/10967, 3 pages.

Search Report, dated Jun. 6, 2007, for EP Patent Application No. EP 027 8 8089, 6 pages.

* cited by examiner

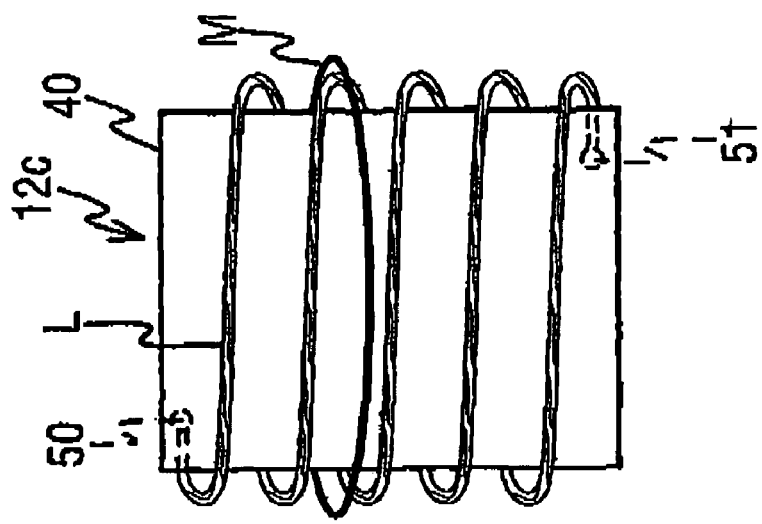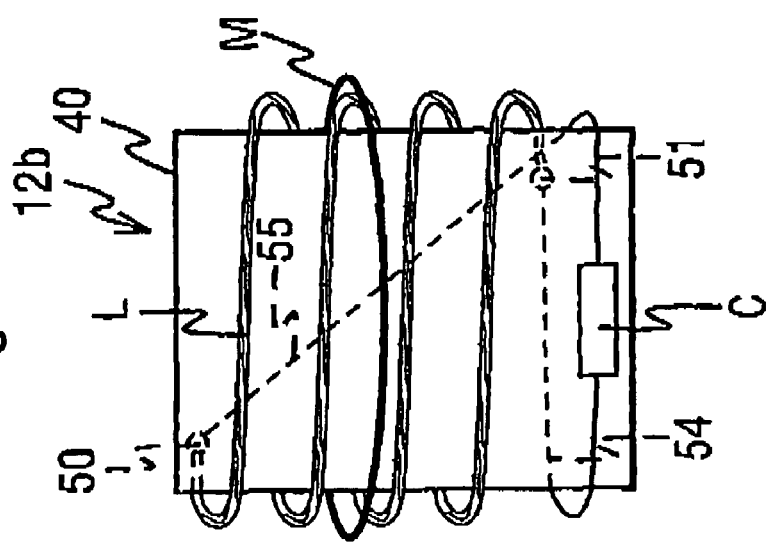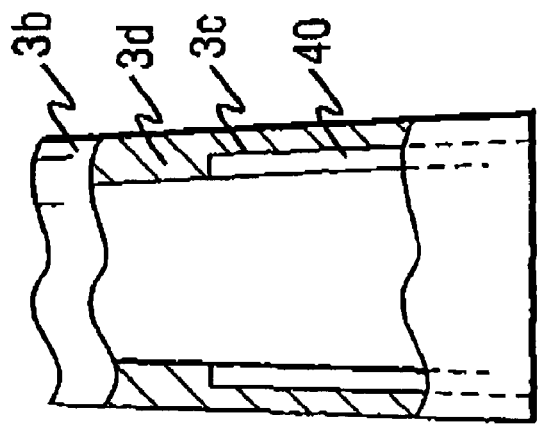

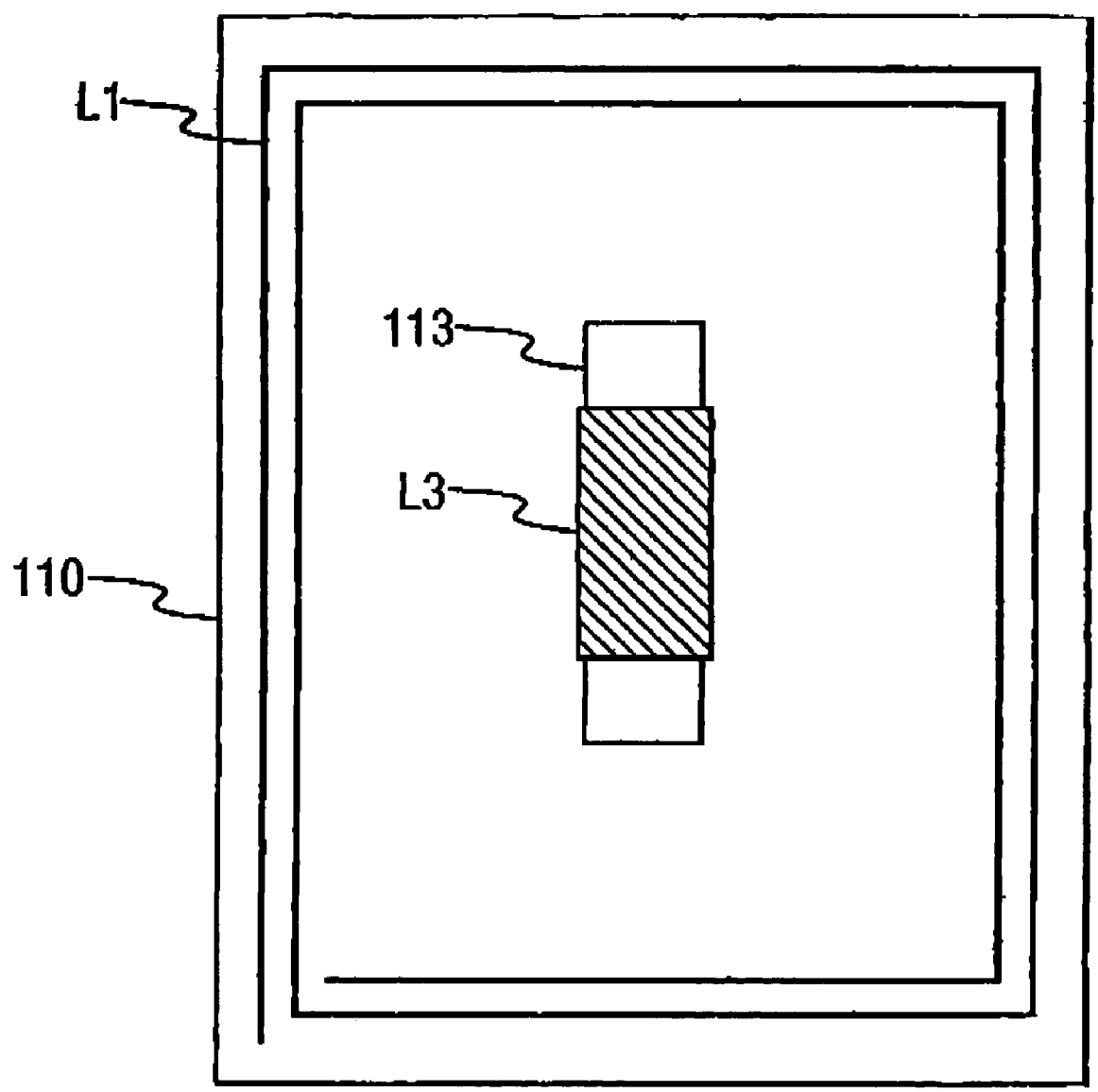

DETECTABLE COMPONENTS AND DETECTION APPARATUS FOR DETECTING SUCH COMPONENTS

CROSS REFERENCE TO RELATED APPLICATIONS

This application is a Continuation of International Application No. PCT/GB02/05583, filed Dec. 10, 2002, which claims the priority of Great Britain Patent Application Nos. 0129492.5, filed Dec. 10, 2001, and 0224431.7, filed Oct. 21, 2002 the content of all of which is incorporated herein by reference.

This invention relates to detectable components and detection apparatus for detecting such components.

There are many forms of electronic devices or electrical appliances that are designed to operate with attachable or detectable components. Examples are medical devices such as, for example, medical drug delivery systems, disposable sets or disposable accessories for such delivery system, electric power tools, food processors, portable vacuum cleaners, hair dryers and so on. In some cases, such electronic devices or electrical appliances may accidentally be operated with an incorrect attachable component or even with no attachable component. This may present safety problems. Thus, for example in the medical field the use of an incorrect attachable component may be detrimental to patient health. Also, in the case of battery-operated electronic devices or electrical appliances the use of an incorrect attachable component may be wasteful of battery life.

In areas other than electronic devices and electrical appliances, for example, in areas of security and branding it is desirable to be able to identify a product or item In one aspect, the present invention provides detection system comprising a detectable apparatus for detecting detectable components having a resistance that varies with magnetic field when the detectable component is subjected to an excitation field, the detection apparatus comprising:

magnetic field providing means for subjecting a detectable component to a magnetic field;
 excitation field providing means for subjecting the detectable component to an excitation field;
 control means for controlling at least one of the magnetic field providing means and the excitation field providing means to vary at least one of the magnetic field and excitation field;
 resistance determining means for determining a change in the resistance characteristics of the detectable component in response to variation of the at least one of the magnetic field and excitation field; and identifying means for identifying the particular detectable component from the determined change in resistance.

In an embodiment, the control means is arranged to control the magnetic field generating means to change at least one of a magnitude and polarity of the magnetic field to enable the identifying means to identify a characteristic resistance signature of the detectable component.

In one aspect, the present invention provides a detectable component having first inductive coupling means adapted to couple to second inductive coupling means of a detection apparatus when the detectable component is in range of or coupled to the detection apparatus, the detectable component having an inductive element comprising a multi-stranded coil and a resistive component having a resistance that varies with magnetic field so that, when the detectable component is subject to a change in magnetic field, the variation in resistance of the resistive component results in corresponding amplitude modulation of a carrier or excitation signal supplied to the second inductive coupling means. The detection apparatus can thus detect the presence of the detectable component without the need for any physical electrical connection such as wires connecting the detection apparatus to the component.

In an embodiment, the present invention provides a detectable component having first inductive coupling means adapted to couple inductively to second inductive coupling means of a detection apparatus when the detectable component is in range of or coupled to the detection apparatus, the first inductive coupling means having a resistive component with a resistance that varies with magnetic field so that when a high frequency carrier signal is supplied to the second inductive coupling means and the detectable component is subject to a varying magnetic field, the carrier is amplitude modulated and this modulation can then be used to detect the presence of the detectable component.

In an embodiment, the first inductive coupling means comprises a coil of Litz wire. Litz wire is multi-stranded fine wire wherein individual wires are insulated from one another and are bunched or braided together, for example in a uniform pattern. The use of a coil consisting of wire having many such parallel-connected paths, provides a larger surface area than would be provided by a solid conductor without significantly increasing the size of the conductor and so avoids the power losses that occur in solid conductors due to the "skin effect", that is the tendency of radio frequency current to be concentrated at the surface of a conductor making the detectable component more easily detectable.

In an embodiment, the resistive component has a resistance that varies with magnetic field. Generally, the resistive component is a material exhibiting the giant magneto-impedance effect (GMI), that is the variation of resistance with magnetic field when a high frequency alternating current is passed through the material. Examples of such materials are, for example, amorphous cobalt alloys and nickel-iron plated beryllium-copper wire. Any material that exhibits magnetic impedance properties may be used in place of the GMI material.

In an embodiment, the first inductive coupling means comprises a coil comprising GMI material. For example, the coil may be formed of layers of GMI material separated by a dielectric material and wound to form the coil. The coil may be formed of a bundle of wires or strands of GMI wire.

In an embodiment, the first inductive coupling means includes a capacitor. The first inductive coupling means may form a resonant circuit.

In an embodiment, the resistive component comprises a further coil inductively coupled to the coil.

In an embodiment, the resistive component comprises a further coil and the two coils form first and second transformer windings.

Where the resistive component forms a coil, then the coil may consist of a single closed-loop turn.

According to one aspect of the present invention, there is provided a detectable component having first inductive coupling means adapted to couple inductively to second inductive coupling means of a detection apparatus when the detectable component is in range of or coupled to the detection apparatus, the first inductive coupling means consisting solely of a component formed of a material having a resistance that varies with magnetic field to cause modulation with magnetic field of a carrier signal supplied to the second inductive coupling means of the detection apparatus.

The component may have a skin resistance that varies with magnetic field. The resistive component may be a material exhibiting the GMI effect such as, for example, an amorphous cobalt alloy. The component may be in the form of a closed loop, ring or disc, loops, rings or discs, a strip or strips, for example. A composite component may be formed by physically locating a number of loops or strips in a particular physical layout, or by mixing or collocating a series of individual components with different magnetic properties or signatures.

In an embodiment a detectable component as set out above also includes a passive device that is operable, when the detectable component is coupled to or is in range of the detection apparatus, to derive power from the detection apparatus and to communicate with the detection apparatus. In an embodiment, the passive device is a passive data storage device which may have a memory storing data. In an embodiment, the passive data storage device derives power from a carrier signal supplied by the detection apparatus and communicates data by modulating that carrier signal in accordance with data read from a memory. The carrier signal may be the carrier signal supplied to the second inductive coupling means. As used herein, the term "passive" means that the device is not self-powered but derives power from the detection apparatus when coupled thereto.

The passive data storage device may have write means for writing data to the memory.

The detectable component way comprise or form part of a subsidiary body usable with a main body. For example, the subsidiary body may be couplable or attachable to and/or detachable from the main body. The main body may be the main body of an electrical appliance or electronic device and the subsidiary body may be a tool or accessory for use therewith, for example, a tool or accessory for use with a medical device such as a medical drug delivery system, a disposable set or disposable accessory for such a delivery system, an implement for a food processor or a vacuum cleaner, a tool or bit for an electrical power tool or drill or the like, an attachment or accessory for a hair dryer and so on, while the detection apparatus may be provided in a main body of the electronic device.

In an embodiment, the subsidiary body comprises a substrate such as a page or document and the main body comprises detection apparatus which may be in the form of a pen or wand or other hand holdable shape, for example.

In an aspect, the present invention provides an electrical appliance or electronic device having a main body and a subsidiary body, the subsidiary body having first inductive coupling means and the main body having second inductive coupling means adapted to couple inductively to the first inductive coupling, means when the subsidiary body is in range of or coupled to the main body, the main body having carrier signal supplying means for supplying an excitation carrier signal to the second inductive coupling means and magnetic field generation means for subjecting the subsidiary body to a varying magnetic field, the first inductive coupling means comprising a coil having a plurality of electrically conductive paths coupled in parallel and having a resistive component with a resistance that varies with magnetic field to cause modulation of the carrier signal, the main body having modulation detection means for detecting modulation of the carrier signal caused by variation of the resistance of the resistive component due to changes in the magnetic field when the first and second conductive coupling means are coupled.

In an embodiment, the present invention provides an electronic device or electrical appliance having a main body and a subsidiary body, the subsidiary body comprising a detectable component having first inductive coupling means and the main body having second inductive coupling means adapted to couple inductively with the first inductive coupling means when the subsidiary body is in range of or coupled to the main body, the main body having magnetic field generation means for subjecting the subsidiary body to a varying magnetic field and carrier signal supplying means for supplying an excitation carrier signal to the second inductive coupling means, the first inductive coupling means consisting solely of a coil of the material that has a resistance that, in the presence of the carrier signal, varies with magnetic field to cause modulation of the carrier signal, the main body having modulation detection means for detecting modulation of the carrier signal caused by variation of the resistance of the coil due to the varying magnetic field when the first and second inductive coupling means are coupled.

In an embodiment, the magnetic field generation means comprises means for generating a relatively low frequency varying magnetic field, for example an excitation coil and low frequency source. In an embodiment, the carrier signal has a frequency of, typically, 13.56 MHz (Mega Hertz) while the low frequency signal has a frequency value that typically lies in the range of from 100 Hz (Hertz) to 500 Hz, for example 250 Hz.

In an embodiment, the magnetic field generation means comprises a magnet that moves with a component of the main body, for example the magnet may be mounted on a motor drive shaft.

In one aspect, the present invention provides detection apparatus for detecting a detectable component having first inductive coupling means and a resistive component that, when supplied with a high frequency signal, has a resistance that varies with magnetic field but is insensitive to magnetic field polarisation, the detection apparatus having second inductive coupling means adapted to couple to the first inductive coupling means and the detection apparatus also having carrier signal supplying means for supplying a relatively high frequency excitation carrier signal to the second inductive coupling means, magnetic field generation means for generating a symmetrically oscillating magnetic field at a given frequency and modulation detecting means for detecting modulation of the carrier signal at a frequency twice the given frequency. In an embodiment, the magnetic field generation means generates a sinusoidally varying field.

In some cases, the electronic device or electrical appliance may simply identify whether or not a subsidiary body is present and, if not present, inhibit operation of the electronic device or electrical appliance. In other cases, where a number of subsidiary bodies can be used with the same electronic device, then the electronic device may be able to recognise the type of subsidiary body and to adjust its operation accordingly. For example, the electronic device may adjust the motor drive speed of the electronic device to be adjusted to meet the requirements of a particular attachable component.

Embodiments of the present invention will now be described, by way of example, with reference to the accompanying drawings in which:

FIG. 5 shows a very diagrammatic part-sectional view of the attachable component shown in FIG. 1 to illustrate the incorporation of a detectable component therein;

FIGS. 6a and 6b illustrate how the detectable components shown in FIGS. 4a and 4b, respectively, may be constructed for incorporation in the attachable component shown in FIG. 5;

FIG. 8 shows one way in which a detectable component incorporated in the attachable component shown in FIG. 7 may be formed while

FIG. 17 shows a plan view of a coil assembly of the detection apparatus shown in FIG. 16.

Figure 1:
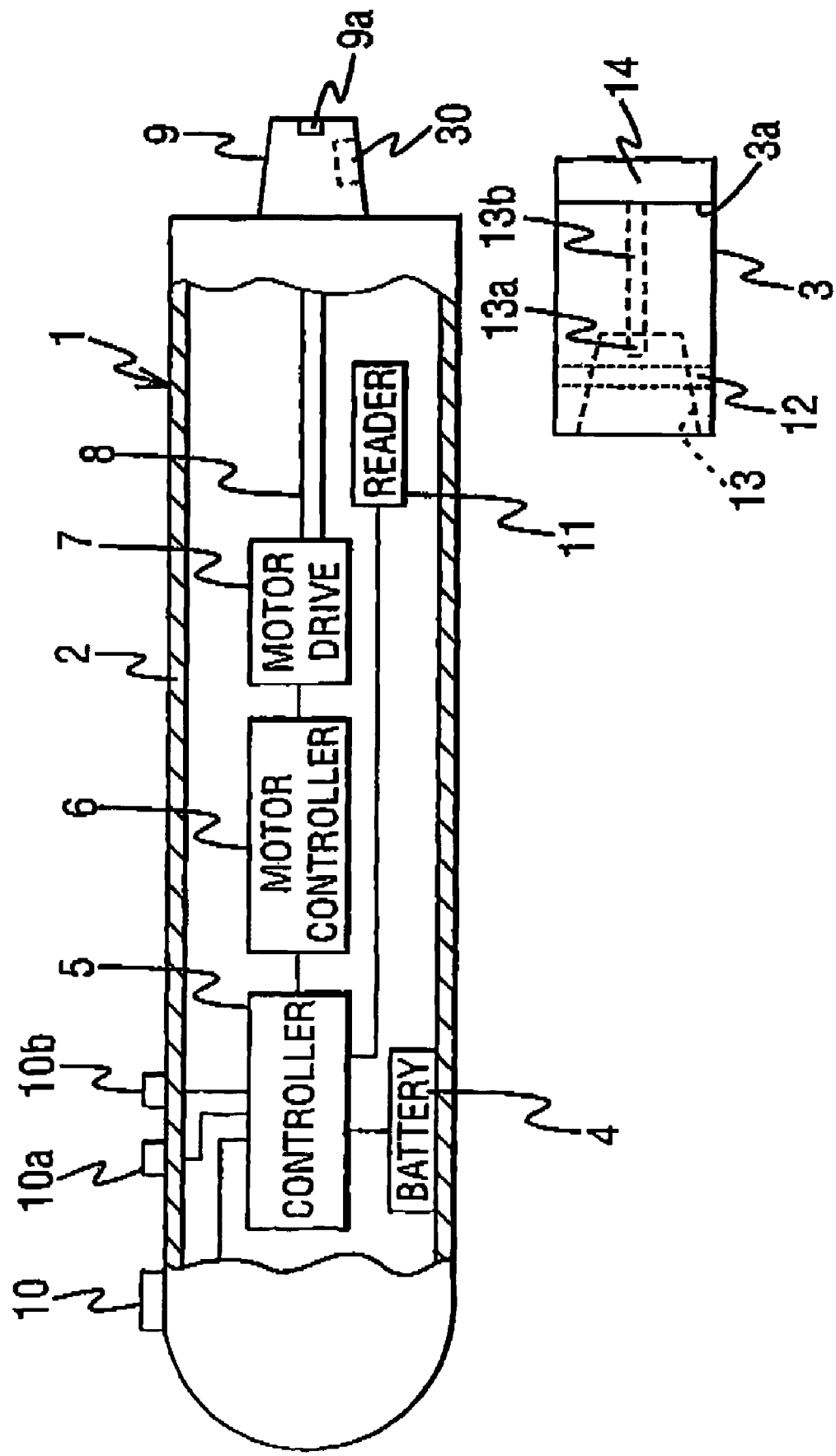
FIG. 1 shows a diagrammatic representation of an electrical appliance embodying the invention with a subsidiary body in the form of an attachable component or tool being shown separated from a main body of the electrical appliance and the main body being shown partly in section.

Referring now to the drawings, FIG. 1 shows a diagrammatic representation of an electronic device or electrical appliance 1 embodying the invention having a main body 2 and subsidiary body 3 shown separated from the main body 2. In this example, the electronic device is a battery-operated tool and the subsidiary body 3 is any one of a number of different attachable components or tools that enable a user of the tool to carry out different operations. For example the subsidiary body may be an abrading or erasing tool, a sanding tool, a screwdriver tool, a polishing tool, a reaming tool or a routing tool. In the interests of simplicity, the bit or head 14 of the attachable component that actually effects the operation (sanding, abrading, erasing, screwing and so on) is shown very diagrammatically in FIG. 1 and with no detail because these details will be the sate as those of a conventional head or bit.

The main body 2 is shown part cut away to show the functional components of the electronic device. In this case, the functional components include a battery 4 which may, as is known in the art, be a rechargeable battery. The battery 4 provides a power supply for the remaining functional components of the electronic device. In the interests of simplicity, however, the connections from the battery to the other components are not shown.

The other components of the main body include a controller 5 in the form of a micro-controller, micro-processor or state machine coupled to a motor controller 6 itself coupled to a motor drive 7. The motor drive 7 consists, as is well known in the art, of a motor and gear train and the motor controller 6 controls activation and the speed of rotation of the motor drive. An output shaft 8 of the motor drive is coupled to rotate a mechanical coupling connector 9 of the main body extending through an opening in the housing of the main body 2. The functional components of the main body also include a user interface which in this case is in the form of an on/off switch 10 but may also include, for example, a light emitting device or devices 10& that provide an indication to the user of the status of the device (for example whether the battery is charged) and a rudimentary loudspeaker 10b for providing an audible warning beep, for example in the event of low battery power.

The functional components so far described are similar to those present in a conventional electrical power tool although, generally, the controller 5 may not be necessary. In this regard, it will, of course be appreciated that the extent and shape of the motor drive shaft or the actual configuration of the drive coupling to the attachable component will depend upon the particular electronic device.

In addition to the controller 5, the functional components of the main body 2 include a reader 11 that, as will be described below, is arranged to detect the presence of a detectable component 12 carried by the attachable component 3 when the coupling connector 9 of the main body 2 is received within a coupling connector 13 of the attachable component 3 so that a coupling element 9a of the coupling connector 9 is coupled to an end 13a of a drive train 13b (illustrated in FIG. 1 as a simple drive shaft) within the attachable component to cause the head 14 to rotate with the drive shaft 8 in the usual manner relative to the body of the attachable component. Although only a simple mechanical connection is shown, it will of course be appreciated that a more sophisticated coupling, such as a chuck and key coupling may be provided. As another possibility, the main body may have a drive socket for receiving a coupling portion of the detectable component.

The head 14 is thus rotatably mounted to the attachable component body 3a and, as is known in the art, when the attachable component 3 is mounted on the body 2, the coupling element 9a engages the drive coupling arrangement 13b provided within the attachable component 3 enabling the motor drive 7 to rotate, oscillate, vibrate or reciprocate the head 14.

In the present embodiment, when the user activates the electrical appliance using the on/off switch 10, the controller causes the reader 11 to check for the presence of a detectable component 12. If an attachable component is correctly mounted to the main body, then the reader 11 detects the detectable component 12 and provides a signal to the controller 5 causing the controller 5 to activate the motor controller 6 to enable use of the electrical appliance in known manner. If, however, a attachable component 3 is not mounted to or is not correctly mounted to the main body 2 when the on/off switch 10 is actuated, then the reader 11 will not detect the presence of the detectable component 12 and the controller 5 will inhibit operation of the motor controller 6. This prevents accidental actuation of the electrical appliance in transit, for example when placed in a carrying case or bag, and also prevents a user inadvertently activating the electrical appliance without having first mounted an attachable component onto the drive shaft 8 and also prevents a user activating the electrical appliance if the attachable component 3 is not securely mounted to the body 2 and is therefore in danger of becoming detached during use.

Examples of electronic devices or electrical appliances embodying the invention will now be described with reference to FIG. 2 which shows a block diagram of the functional components of the main body 2 to illustrate in greater detail one example of a reader 11 suitable for use in detecting a detectable component and FIGS. 4*a* to 4*d* which show different detectable components 12*a* to 12*d*.

The detectable components shown in FIGS. 4*a* to 4*d* each have a first inductive coupler adapted to couple inductively to a second inductive coupler forming part of the reader 11 when the attachable component 3 is correctly mounted on the main body 2. In each case, the first inductive coupler comprises a coil and has a resistive component formed of a material exhibiting the Giant Magneto Impedance (GMI) effect, that is a material that has a skin resistance that, when a relatively high frequency oscillating signal is supplied through the material, varies with magnetic field. The resistive component may be formed of, for example, a cobalt amorphous alloy, as described in detail in a paper entitled "High frequency giant magneto impedance in Co-rich amorphous wires and films" published in the Journal of the Magnetic Society, Japan volume 19 pages 265-268 in 1995 by L V Panina and K Mohri of the department of Engineering of Nagoya University. Other possible GMI materials include nickel-iron plated beryllium copper wire. As another possibility, the GMI material may comprise VITROVAC ribbon manufactured by Vacuumschmelze of Germany which can be obtained in the form of thin (typically 20 to 25 micrometres) strips having a strip width of 0.75 millimetres. Similar material is available from other manufacturers in wire form and as fine (typically 50 micrometre diameter) glass-coated wire. As another possibility, the GMI material may be deposited (for example by vacuum or sputter deposition) onto a suitable substrate such as a ceramics or plastics material substrate.

Figure 2:
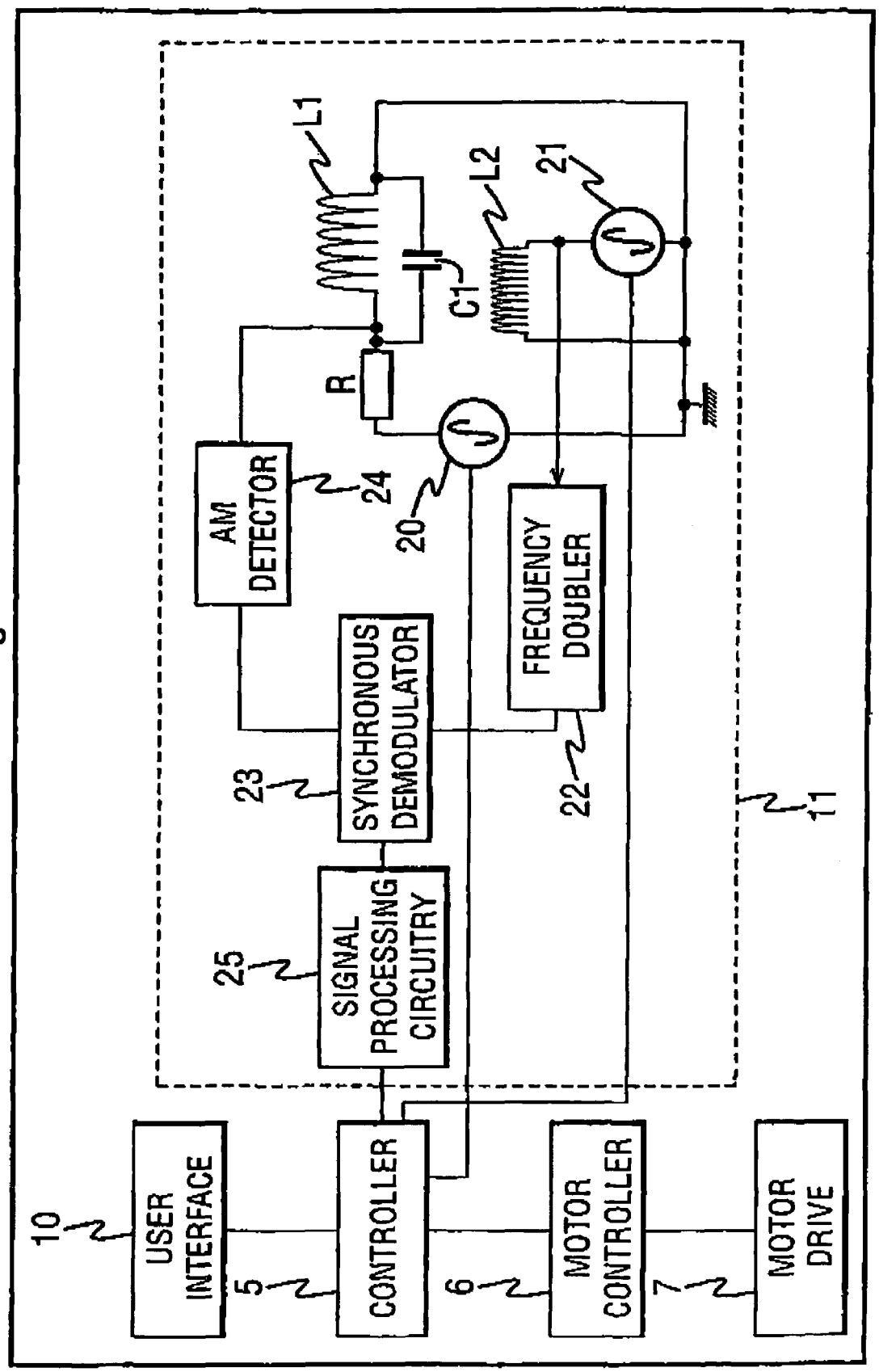
FIG. 2 shows a block diagram of functional components of the main body shown in FIG. 1 illustrating one example of a reader or detection apparatus embodying the present invention.

As shown in FIG. 2, the second inductive coupler provided by the reader 11 comprises a parallel connection of a sensing coil or inductor L1 and a capacitor C1 coupled in series with a resistor R. The reader 11 also includes a further, modulation, coil L2.

The sensing coil L1 is coupled to a carrier or excitation signal generator 20 arranged to generate a high frequency carrier or excitation signal having a frequency of, typically, 13.56 MHz (Mega Hertz). The modulation coil L2 is coupled to a relatively low frequency signal generator 21 arranged to generate an oscillating, in this case a sinusoidal, signal that can be pulsed under the control of the controller 5. Typically, the low frequency signal generator 21 is provided to generate a signal having a frequency value that typically lies in the range of from 10 Hz (Hertz) to 500 Hz, for example 250 Hz. The motor drive 7 frequency is selected to avoid any possibility of mechanical movements (in particular movement of magnetic materials) causing interference and, typically, has a value in the range 20 Hz to 90 Hz.

As shown, the low frequency generator 21 is also coupled to a frequency doubler 22 that provides a "clock signal" for a synchronous demodulator 23. An amplitude modulation (AM) detector 24 is coupled to the inductor L1 and provides an input to the synchronous demodulator 23. A demodulated signal output by the synchronous demodulator 23 is supplied to signal processing circuitry 25 that outputs a digital square wave signal to the controller 5. The signal processing circuitry 25 may include, for example, an analogue to digital (A/D) converter and buffering circuitry.

Figure 4A:
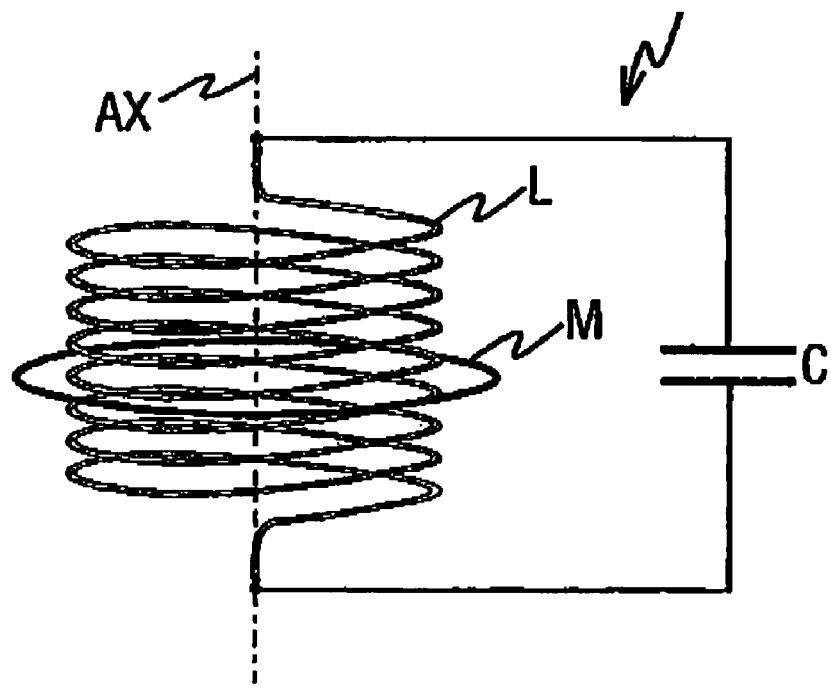
FIGS. 4a to 4d illustrate circuit diagrams for different forms of detectable components embodying the present invention.

The detectable component 12*a* shown in FIG. 4*a* consists of a Litz wire inductive component or coil L coupled to a capacitor C that acts to tune the coil and a GMI resistive component formed as a simple closed loop coil M around and insulated from the inductive component L so that there is no physical connection between the two coils. As shown, the closed loop M consists of a single turn. It may, however, have 2, 3 or more turns, depending upon the characteristics required of the circuit.

In this embodiment, the two coils L and M effectively form the primary and secondary windings of a transformer with the GMI closed loop M forming the secondary winding that loads the high Q tuned LC circuit of the primary winding.

The resulting tuned circuit will typically have a resonant frequency in the range 20 kHz to 50 MHz with the optimum frequency for the GMI material being dependent upon the particular material.

When the user activates the electrical appliance 1 using the user interface or on/off switch 10, then the controller 5 activates the high frequency oscillator 20 to output the high frequency carrier or excitation signal to the sensing coil L1 and activates the low frequency signal generator 21 to produce low frequency pulses causing the modulating coil L2 to create an oscillating magnetic field. If the attachable component illustrated in FIG. 4*a* is correctly mounted to the main body 2, then the mutual coupling of the first and second inductive couplers will cause a decrease in the amplitude in the carrier signal in the inductor L1 with this amplitude being modulated in accordance with the change in resistance of the resistive component a due to the magnetic field generated by the pulsed low frequency oscillator 21. Because the detectable component shown in FIG. 4*a* provides a tuned circuit, subjecting the GMI resistive component R to a magnetic field alters its resistance and affects the Q factor of a tuned circuit. This, in turn, affects the "loading" or modulation of the high frequency carrier signal by virtue of the mutual coupling between the first and second inductive couplers.

Thus, the mutual coupling of the first and second inductive couplers will cause a decrease in the amplitude in the carrier signal in the inductor L1 with this amplitude being modulated in accordance with the change in resistance of the resistive component R due to the magnetic field generated by the pulsed low frequency oscillator 21.

The use of a multi-stranded wire, generally Litz wire, to form the inductive component L increases the skin surface area without any significant increase in the overall conductor size, so avoiding or at least reducing the power losses compared to those which are incurred in solid conductors due to skin effects at high frequencies. The use of such multistranded conductor to form the inductive component thus greatly improves the Q factor of the inductive component and therefore the Q factor of the resonant circuit. In addition, Litz wire is available at very low cost as it is used in large quantities within conventional AM radios. Accordingly, the use of Litz wire enables the formation of a relatively cheap inductor with a much improved Q factor. Experiments have shown that replacing a conventional solid conductor formed inductor with a Litz wire formed inductor can increase the modulation of the carrier signal in the reader coil by a factor of three or more. However, in applications that do not require the best possible C, as another possibility enamelled copper wire or a PCB (Printed Circuit Board) coil may be used.

The effective resistance of the GMT loop M is proportional to the square of the ratio of the number of turns in the inductive component L coil to the number of turns in the closed loop M enabling the sensitivity to be improved by adjusting this ratio, generally using a single turn for the closed loop M.

In the detectable component 12a shown in FIG. 4a, a separate capacitive component C is used to tune the circuit. The inductive component L may, however, be designed so that the inter-winding capacitance can take the place of the capacitor C. In this case, the capacitor C may be omitted.

Figure 4B:
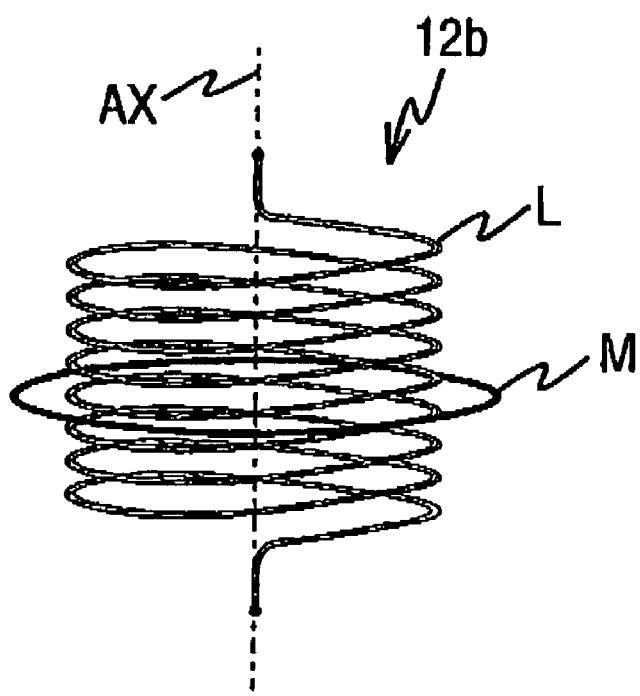
Figure 4C:
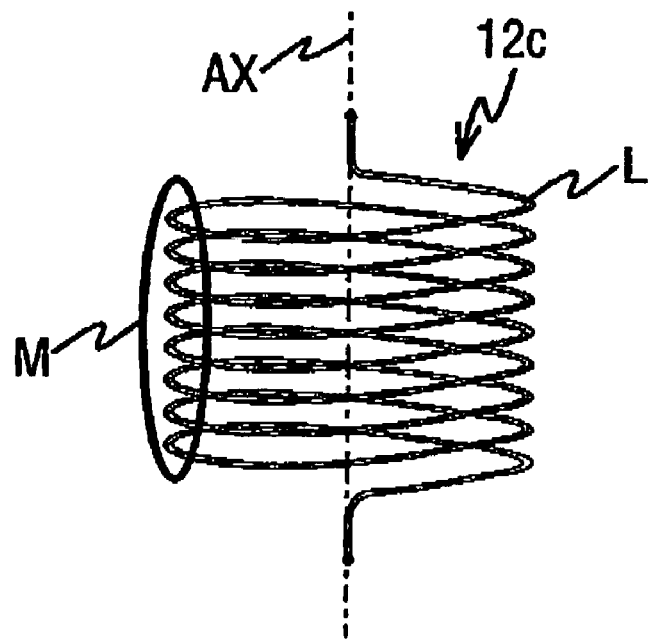
Figure 4D:
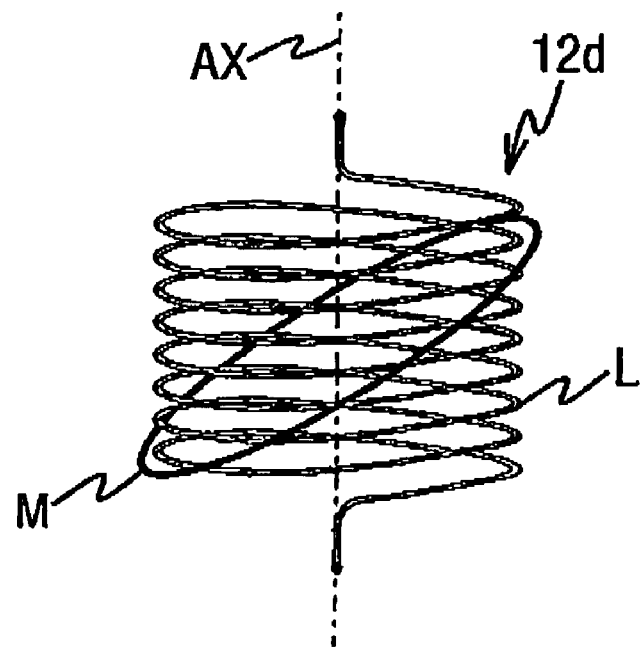

FIG. 4b shows a circuit diagram for another form of detectable component 12b embodying the present invention. In this case, the detectable component consists of an open-circuit inductive component L formed of about 70 turns of Litz wire around which is provided the closed loop M ant GMI material as described with reference to FIG. 4a. The floating (open-circuit) Litz wire inductive component L is designed to be self-resonant at the carrier frequency of the high frequency signal generator 20 (13.56 MHz in this example). As mentioned above, the closed loop M may consist of more than one turn. However, the arrangement show should enable the maximum possible coupling to the reader sensing coil L1. In this embodiment, there is no separate capacitor, rather the detectable component 12b relies upon the inter-winding capacitance of the inductive component L to provide the tuned circuit. The absence of a separate physical capacitor C and the fact that no electrical connections are required to this detectable component 12b makes the construction of this detectable component very simple and of low cost.

As shown in FIGS. 4a and 4b, the normal to the plane of the closed loop M is parallel to the axis AX of the coil forming the inductive component L so that, effectively the inductive component and the closed loop form the primary and secondary of a transformer. The present inventors have found that, surprisingly, the orientation of the closed loop M relative to the longitudinal axis AX of the inductive component L can be rotated through 90 degrees from that shown in the FIGS. 4a and 4b so that, as illustrated by the detectable component 12c shown diagrammatically in FIG. 4c, the closed loop M is oriented along a magnetic flux line and thus affects the resistance of the magnetic field path. Furthermore, the closed loops can be oriented at any angle between the orientations shown in FIGS. 4b and 4c, for example at a 45 degree intermediate position in the detectable component 12d shown in FIG. 4d.

In the case of each of the detectable components illustrated by FIGS. 4a to 4d, if the attachable component is correctly mounted to the main body 2, then when the user activates the electrical appliance 1 using the user interface or on/off switch 10 so that the controller 5 activates the high frequency oscillator 20 to output the high frequency carrier or excitation signal to the sensing coil L1 and activates the low frequency signal generator 21 to produce low frequency pulses causing the modulating coil L2 to create an oscillating magnetic field, the mutual coupling of the first and second inductive couplers will cause a decrease in the amplitude in the carrier signal in the inductor L1 with this amplitude being modulated in accordance with the change in resistance of the resistive component R due to the magnetic field generated by the pulsed low frequency oscillator 21.

The GMI material forming the resistive component R of the detectable component 12a, 12b, 12c, 12d is not sensitive to the polarisation of the magnetic field. Accordingly, if (as in the case where the oscillating magnetic field is a sinusoidally oscillating magnetic field) the oscillating magnetic field is symmetrical, then the high frequency carrier signal will be modulated by a full-wave rectified version of the modulated sine wave supplied by the low frequency carrier signal generator 21. The amplitude modulation of the high frequency carrier signal is therefore predominantly twice the frequency of the low frequency signal generated by the low frequency signal generator 21.

The frequency multiplier 22 "clocks" the synchronous demodulator 23 at twice the frequency of the low frequency signal generator 21 so that the synchronous demodulator 23 extracts modulation at twice the frequency of the low frequency carrier signal. This means that the amplitude modulated signal can easily be differentiated from the original carrier signal supplied by the low frequency carrier signal generator 21 enabling the inductors L1 and L2 to be placed in relatively close proximity to one another without any cross-talk between these two coils swamping or interfering with the signal that the reader is designed to detect.

The properties of the GMI resistive component R significantly reduce the possibility of false detections resulting from a metal object or a shorted turn coming into proximity with the sensing coil L1 while the use of the symmetrical, in this example sinusoidal, low frequency excitation signal and the synchronous demodulator 23 clocked at twice the frequency of the low frequency carrier signal reduce the possibility of the amplitude modulated signal being swamped by cross-talk between the coils L1 and L2 enabling these coils to be placed close together and also allowing the reader 11 to detect detectable components 12 at relatively long range, for example over a range of 3 cm. Where such cross-talk is not a problem, then the frequency doubler may be omitted and the synchronous demodulator replaced by a simple demodulator.

As described above, the controller 5 controls activation of the carrier signal generators 20 and 21. The controller 5 may, however, control activation of a gating circuit that controls application of the carrier signal to the corresponding coil L1 or L2.

Figure 3:
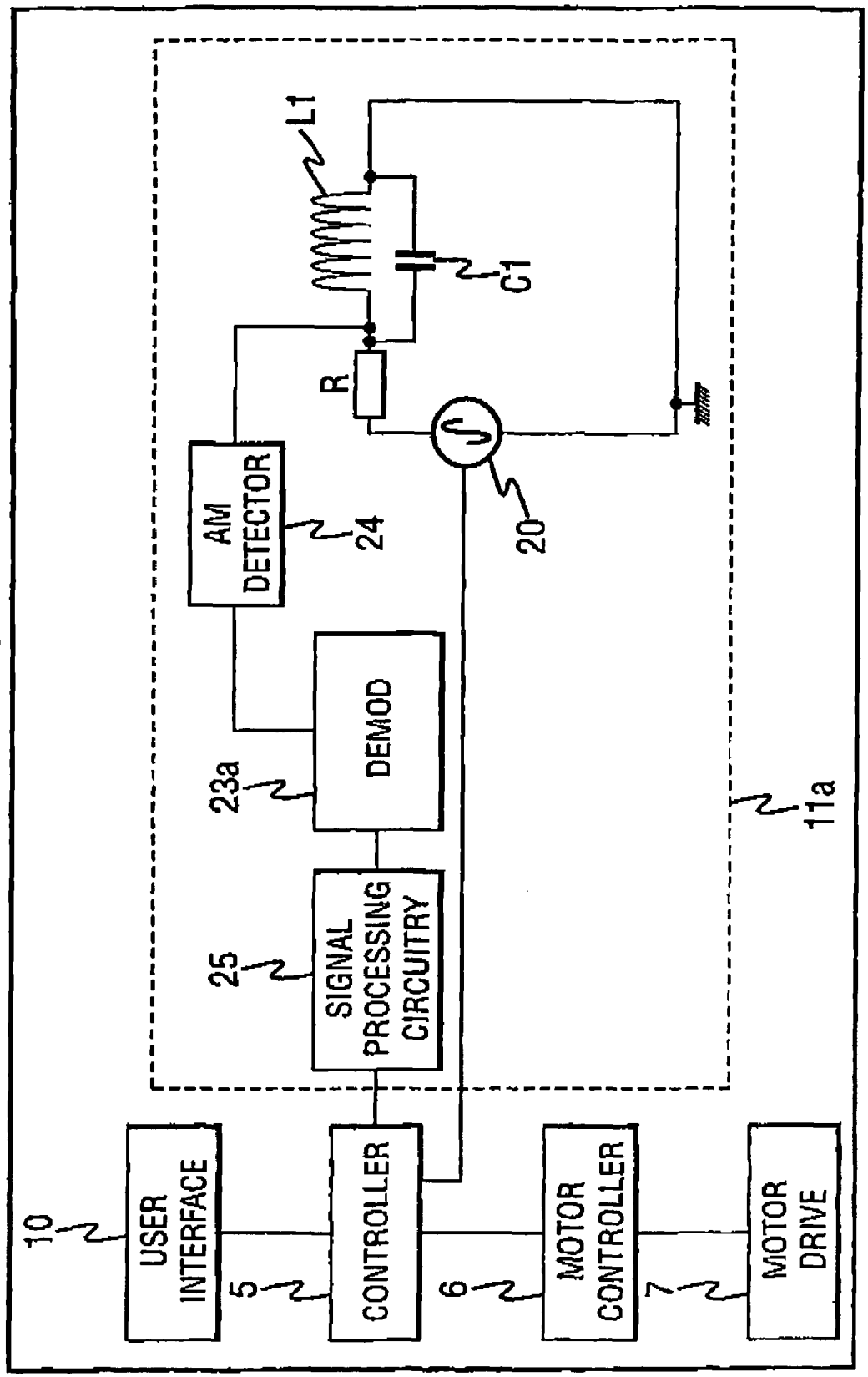
FIG. 3 shows a functional block diagram similar to FIG. 2 but illustrating a different form of reader embodying the present invention.

In the reader described with reference to FIG. 2, a modulating magnetic field that affects the resistance of the resistive component R is generated using the coil L2 and a pulsed low frequency carrier signal provided by the low frequency signal generator 21. Another example of an electronic device or electrical appliance embodying the present invention will now be described with reference to FIG. 3 which shows a functional block diagram of the functional components of the main body. FIG. 3 differs from FIG. 2 in that the reader 11a is not provided with the low frequency signal generator 21 and associated coil L2, frequency multiplier 22 and synchronous demodulator 23. In this embodiment, as shown in phantom lines in FIG. 1, a magnetic element 30 is secured to the drive shaft 8 to provide the magnetic field to which the detectable component 12 is subjected. The detectable component may be as shown in any of FIGS. 4a to 4d.

In this case, when the attachable component 3 is correctly mounted on the main body 2 and the motor drive 7 is activated to rotate or oscillate the drive shaft 8, then the magnetic element 30 will rotate or oscillate with the drive shaft 8 and the magnetic field to which the detectable component 12 is subjected will vary dependent upon the rotation angle of the drive shaft.

The magnet 30 thus provides the modulating field and the skin resistance of the GMI resistive component R will thus vary periodically with the rotation or oscillation of the drive shaft causing, due to the mutual coupling between the first and second inductive couplers, a periodic change in the amplitude of the carrier signal in the sensing coil L1.

This amplitude modulation is detected by the AM detector 24, demodulated by a demodulator (DEMOD) 23a and processed by the signal processing circuitry 25 as described above to provide to the controller 5 a signal representing the change in the resistance of the GMI resistive component and thus the relative location of the magnet and the GMI resistive component.

The controller 5 can then determine the periodicity of the modulation of the carrier frequency and, from this, the rotational speed of the drive shaft 8. The controller 5 is thus provided with feedback regarding the speed of rotation of the drive shaft and the load on the drive shaft exerted by the user during operation of the accessory. In the example shown in FIGS. 1 and 3, the controller 5 may use the information provided by the reader to cause the motor controller 6 to control or adjust the motor drive speed and/or to detect the load on the attachable component, for example to determine whether the user is pressing too hard. If the latter is the case, then the controller 5 may cause the motor controller 6 to disable the drive to the accessory or cause a warning light 10*a* forming part of the user interface to flash or, if the user interface 10 includes the loudspeaker 10*b*, to cause the loudspeaker to issue an audio output, such as a warning beep, to the user if the controller determines that the load on the attachable component is too high.

The embodiment described above with reference to FIGS. 1 and 3 may be implemented in any case where the motor drive causes movement of the permanent magnet, for example where the drive shaft 8 completes a full rotation or oscillates so that the drive shaft only rotates through approximately 60°, by positioning the permanent magnet 30 so that the GMI resistive component of the detectable component 12 is subject to the greatest possible change in field strength as the drive shaft and magnet rotate.

In each of the embodiments described above, the presence of the detectable component in the subsidiary body 3 enables the controller 5 to determine whether or not the subsidiary body 3 is present without the need for there to be any physical electric coupling (for example wires) connecting the main body to the subsidiary body. This means that detection of the presence of the subsidiary body 3 can be effected without having to compromise the integrity of the housing of the main body 2, for example its water-tightness.

Examples of ways in which a detectable component may be incorporated into the subsidiary body 3 will now be described with reference to FIGS. 5, 6*a* and 6*b* where FIG. 5 shows the subsidiary body 3 (part cut-away so that the head or bit 14 is not shown and omitting the drive coupling arrangement 13*b* in the interests of simplicity) shown in FIG. 1 but with a portion of the outer surface 3*b* of the accessory shown cut away.

In this case, the detectable component 12 is provided on a hollow cylindrical plastics material former 40 that fits into a recess 3*c* formed in the wall 3*d* of the accessory 3 and that also provides the coupling connector 13 for enabling mounting of the attachable component 3 onto the main body. FIGS. 6*a* and 6*b* show how the detectable components 12*a* and 12*b* shown in FIGS. 4*a* and 4*b*, respectively, may be provided on such a former 40. In each case, the Litz wire inductive component or coil L is wound around the outside of the former 40 so that ends 50 and 51 of the inductor L are secured to the former. FIG. 6*a* shows the comparable construction for the detectable component 12*a* shown in FIG. 4*a* In this case, the Litz wire inductor L is wound around the former 40 and has its ends 50 and 51 secured thereto. The end 51 is connected by the connecting wire 54 to the capacitor c which itself is connected by a connecting wire 55 to the end 50 of the Litz wire conductor. The single closed loop M of GMI wire is simply wound around the former 40.

FIG. 6*b* shows construction of the detectable component 12*b* on the former 40. In this case, the Litz wire inductive component L is again wound round the former having its ends 50 and 51 secured thereto and the GMI closed loop M is also wound on the former. The detectable components 12*c* and 12*d* may be manufactured in a similar manner with the closed loop M being formed by threading the Litz wire between the former and the inductive component L. It will, of course, be appreciated that, in practice, the coils and loops will be tightly wound onto the former 40 and that the representations shown in FIGS. 6*a* and 6*b* are only very diagrammatic.

Figure 7:
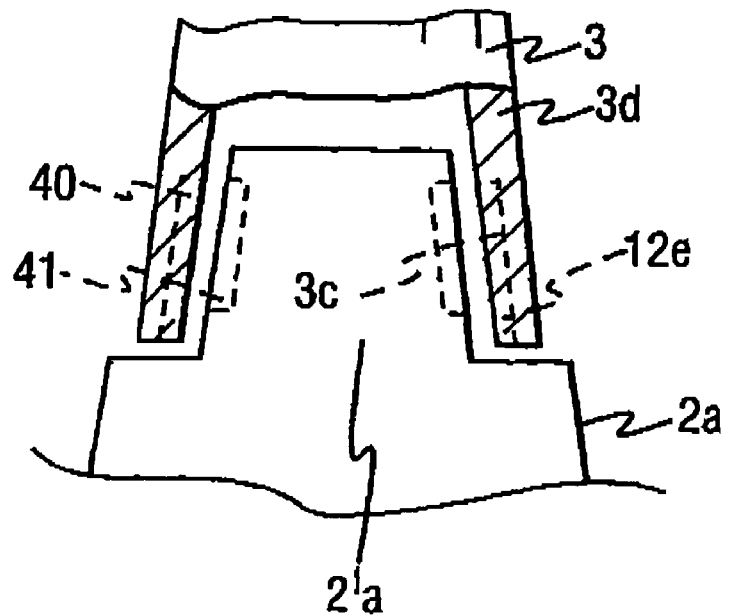
FIG. 7 shows a diagrammatic representation of part of the main body of an electrical appliance and an attachable component coupled thereto to illustrate another form of detectable component embodying the invention.
Figure 8:
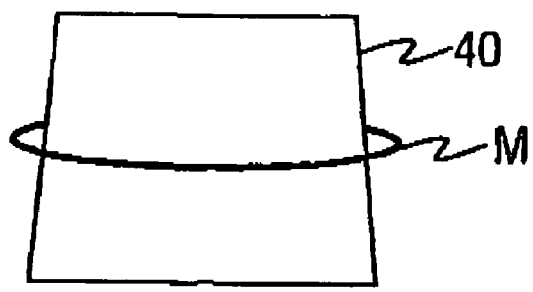

Another example of a detectable component embodying the invention will now be described with reference to FIGS. 7 to 9 where FIG. 7 shows a very diagrammatic representation, part cut away similar to FIG. 5 (and again omitting the drive coupling arrangement 13*b* in the interests of simplicity), of an attachable component 3 mounted to a main body 2. In this case, the detectable component 12*e* is again received in a recess 3*c* in the wall 3*d* of the subsidiary body 3. However, in this case, as shown in FIG. 8, the detectable component consists of a single turn or loop M of GMI material wound on to the former 40. As illustrated diagrammatically by FIGS. 7 and 9, in this embodiment, the reader coil or inductor L1 is located on a former 41 embedded in a portion 2*a* of the housing 2*a* of the main body that extends into the subsidiary body 3 when the subsidiary body 3 is mounted to the main body. In this case, the inductor L1 is formed of Litz wire and, when the subsidiary body 3 is mounted on the main body, the inductor L1 and closed loop M effectively form the primary and secondary of a transformer with, as described above with reference to FIG. 4*b*, changes in skin resistance of the closed loop M due to the presence of a magnetic field when the high frequency carrier signal is flowing through the loop M changing the loading on the inductor L1 and thus modulating the amplitude of the carrier signal as described above. In this case, the detectable component carried by the subsidiary body 3 needs to consist only of a single loop of GMI wire made so that the additional cost of adding the detectable component to the subsidiary body 3 is minimal.

Figure 9:
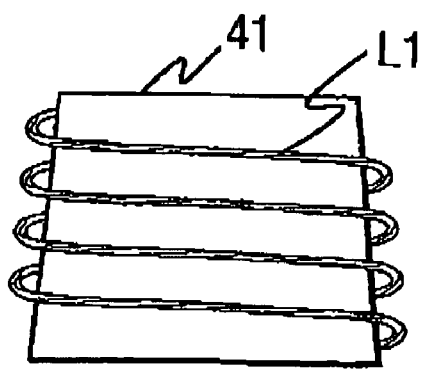
FIG. 9 shows one way in which a coil of the reader shown in FIG. 1 may be incorporated into the main body of the electrical appliance.

The reader circuitry shown in FIG. 2 or in FIG. 3 may be used with the detectable component 12*e* and sensing coil L1 arrangement shown in FIGS. 7 to 9.

In the above described embodiments, the detectable component can be manufactured relatively cheaply and provides a relatively simple yet sensitive way of detecting whether or not the subsidiary body 3 is present.

Figure 10A:
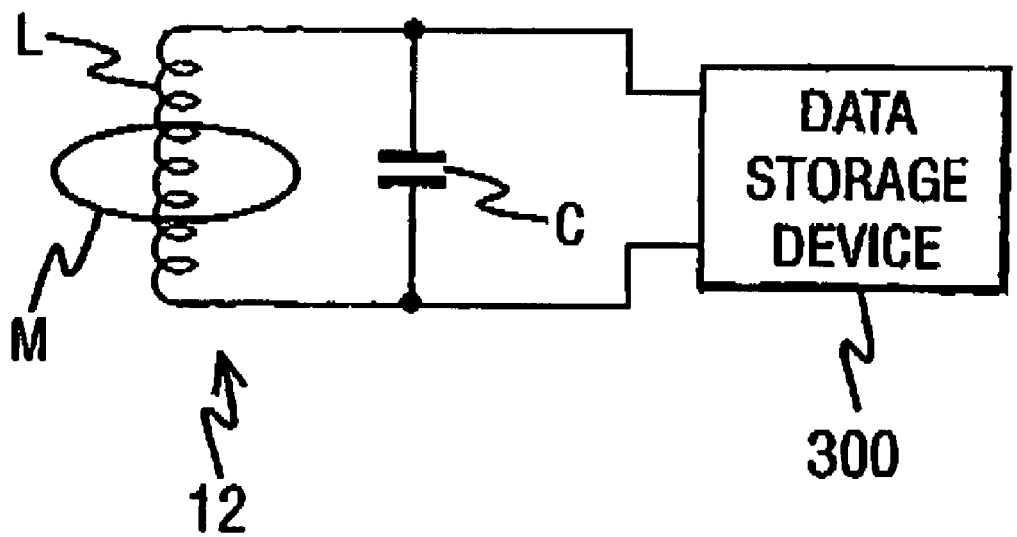
FIG. 10a shows a circuit diagram and FIG. 10b shows a diagrammatic part-sectional representation of an attachable component for illustrating incorporation therein of a detectable component and a passive data storage device.
Figure 10B:
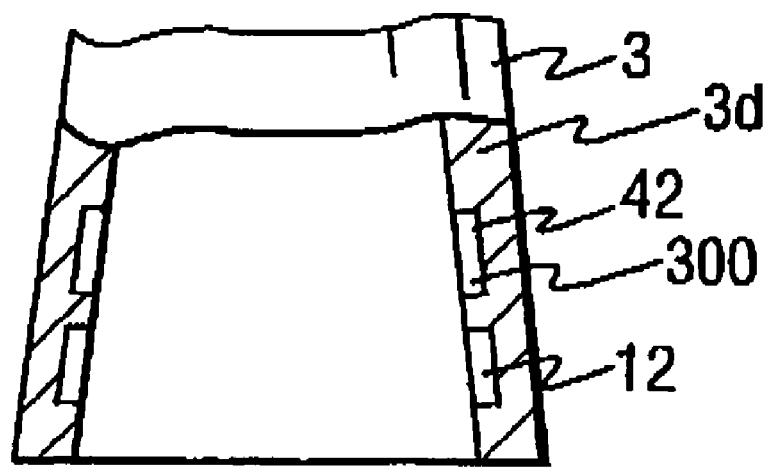

The detectable component may also include a passive (that is not self-powered) data storage device such as an RFID (Radio Frequency Identification Device) Tag and for example as described in, for example, International patent application publication number WO 98/24527. FIG. 10*a* shows a circuit diagram of such a detectable component in which a magnetic field responsive detectable component 12 has the structure shown in FIG. 4*a* and in which the coil L and capacitor C also provide a coupling portion for coupling an RF (radiofrequency) signal from RFID detection apparatus to a passive data storage device 300, in the form of an RFID tag which derives a power supply from the RF signal coupled thereto and, in response, modulates the RF signal with data from its memory. The detection apparatus may be arranged to look first for the magnetic field responsive detectable component 12 (that is for the GMI signature) and then to read data from the RFID tag or vice versa. FIG. 10*b* shows a schematic part cut away view similar to FIG. 5 (and again omitting the drive coupling arrangement 13*b* in the interests of simplicity) of an accessory 3 illustrating the mounting within the wall 3*d* of the subsidiary body 3 of a former 42 carrying the magnetic field responsive detectable component 12 and the passive data storage device 300.

As described in WO 98/24527, the passive data storage device 300 consists of a memory, a power deriving circuit for deriving power from a carrier signal inductively coupled to the passive data storage device and a clock generator for controlling clocking of data out of the memory with the clock generator being arranged to generate a clock signal in synchronism with the carrier signal or arranged simply to be powered by the power deriving circuitry and so to generate an asynchronous clock signal. Clocking of data out of the memory modulates the loading on the inductive coupling means of the passive data storage device and so on the inductive coupling means of the reader. As described in WO 98/24527, such passive data storage devices generally use a 13.56 MHz (Mega Hertz) carrier signal and accordingly the excitation carrier signal generator 20 and inductor L1 of the reader shown in FIG. 2 or 3 may be used to provide the carrier signal for both the passive data storage device 300 and the detectable component 12.

A phase modulation scheme may be used for data transmission as described in WO 98/24527. It may also be possible to use amplitude or frequency modulation although any amplitude modulation scheme must ensure that the signal from the passive data storage device can be distinguished from the modulation caused by the detectable component 12.

The passive data storage device 300 may contain data that identifies the subsidiary body 3 so that where, for example, a number of different accessories may be mounted to the same main body 2, the controller 5 can determine from the data downloaded from the passive data storage device the type of the subsidiary body 3 and control the motor drive 7 accordingly so that, for example, the drive speed is increased or lowered in dependence upon the requirements of the subsidiary body 3. As one example, an electrical appliance may be provided with different subsidiary bodies for use by children and adults and these may have passive data storage devices 300 storing different identity codes (IDs) so that, when the electrical appliance is activated, the controller can determine from the data downloaded from the passive data storage device whether an adult or children's subsidiary body 3 is mounted to the main body 2 and control the motor speed accordingly.

In the above described embodiment, the passive data storage device is a read-only passive data storage device. The passive data storage device may, however, be a writeable passive data storage device as described in, for example, the applicants co-pending International Application No. PCT GB01/05690 (Publication No. WO 02/052419) the whole contents of which are hereby incorporated by reference.

Figure 11:
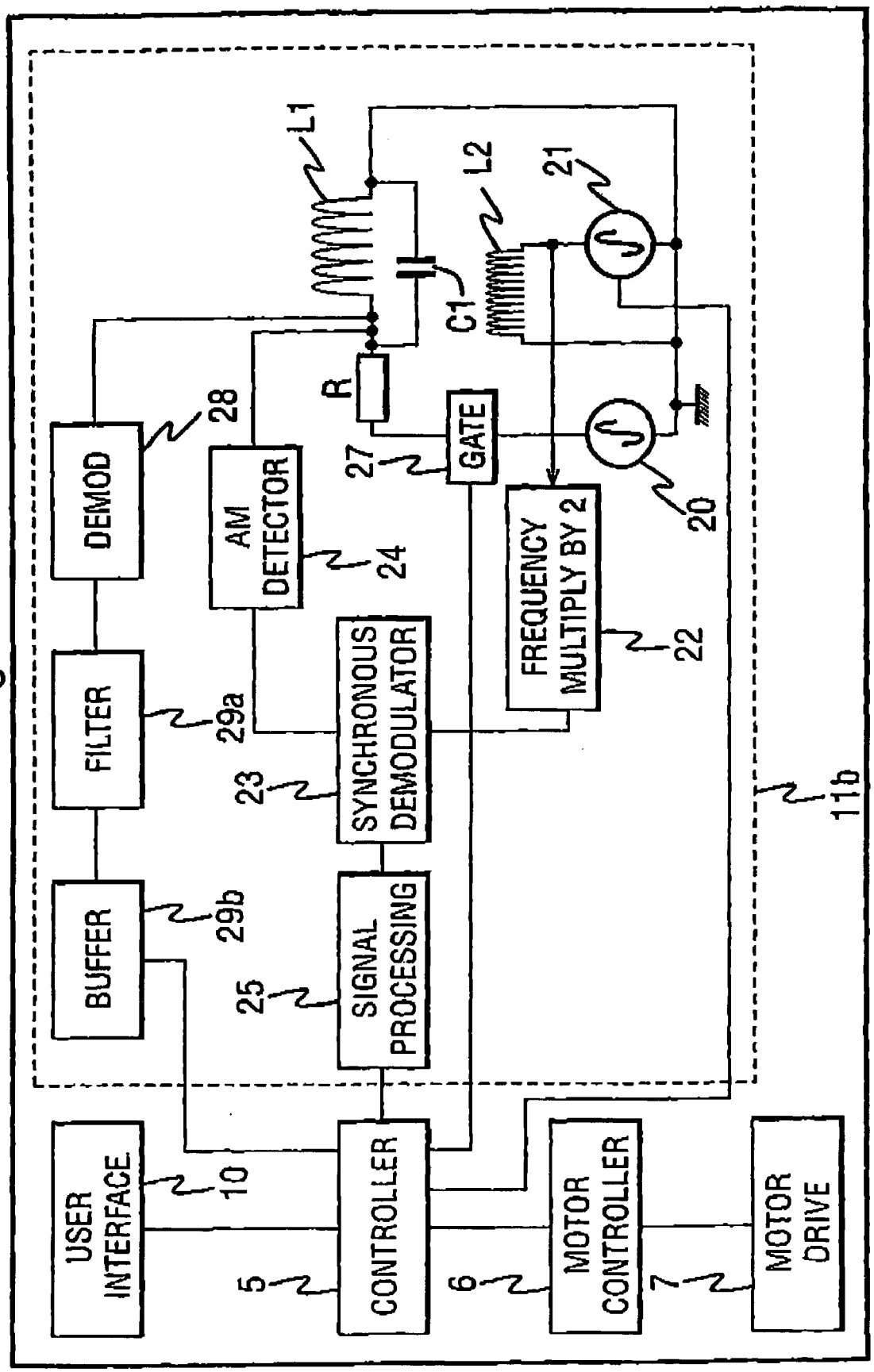
FIG. 11 shows a functional block diagram similar to FIGS. 2 and 3 illustrating a reader for incorporation in an electrical appliance main body suitable for use with the attachable component shown in FIG. 10.

FIG. 11 shows a functional block diagram similar to FIGS. 2 and 3 of the functional components of a main body having the facility to write data to a passive data storage device 300 of a subsidiary body 3. In this case, the reader 11b differs from that described above in that a gate 27 is included to enable the controller 5 to interrupt the high frequency carrier, signal as described in the above mentioned UK patent application no. 0031518.4 so as to enable digital ones and zeros to be represented by long and short gaps between carrier pulses and a separate demodulator 28, filter 29a and buffer/squaring circuitry 29b are provided for enabling reading of data from and writing of data to the passive data storage device. The controller 5 will, in this embodiment, also ensure that, where the low frequency oscillator 21 is provided, this oscillator is deactivated during writing to the passive data storage device 300 to avoid any possibility of the detectable component interfering with the writing operation.

Figure 12:
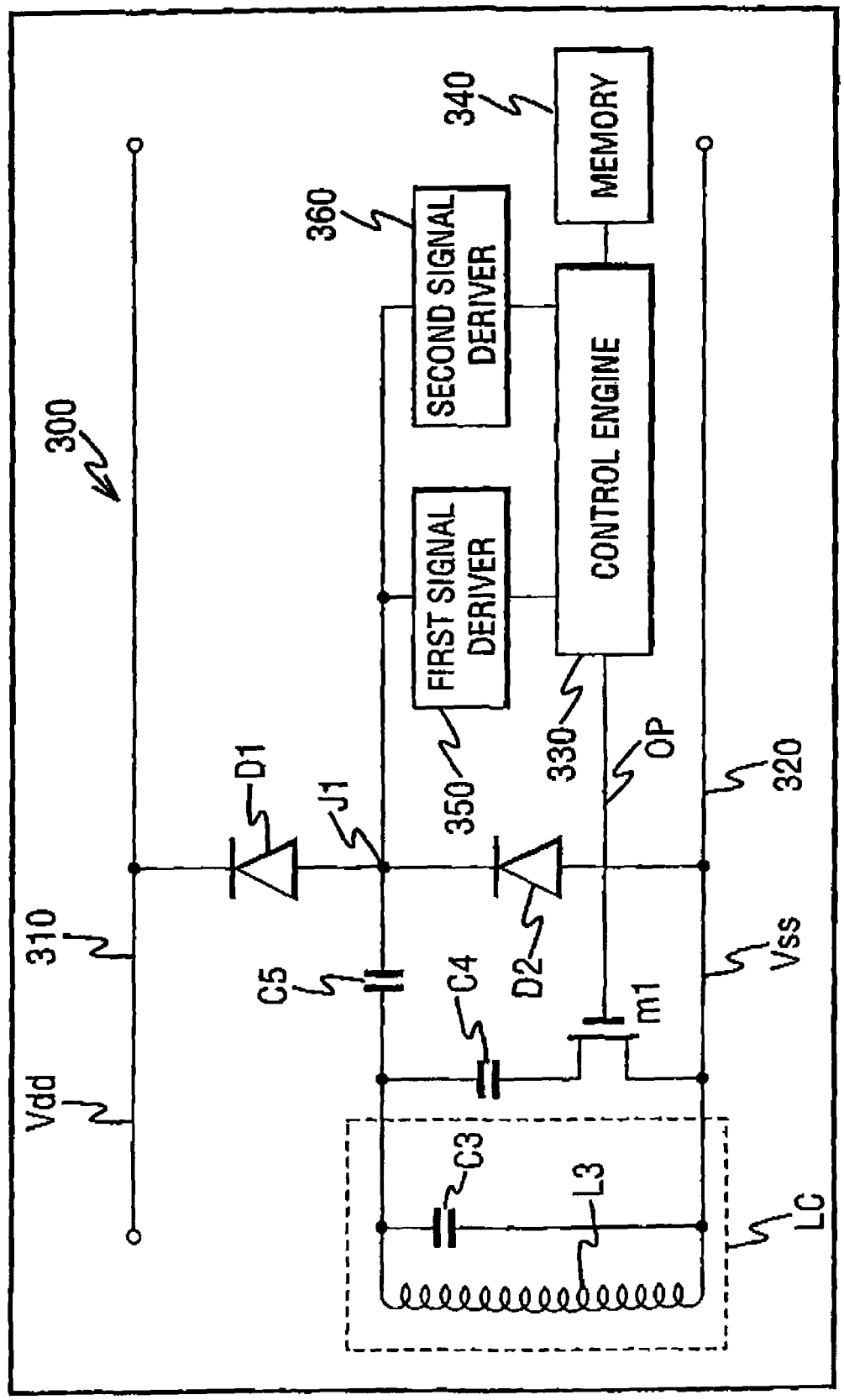
FIG. 12 shows a functional block diagram of an example of a writeable passive data storage device that may be incorporated into the attachable component shown in FIG. 10.

FIG. 12 shows a simplified block diagram of functional components of such a writeable passive data storage device 300. As shown, the passive data storage device 300 is associated with a further inductive coupler LC that forms a tuned circuit with the inductive coupler L1, C1 of the reader 11b. This inductive coupler IC consists of a parallel connection of an inductor L3 and a capacitor C3 across which is coupled a series connection of a capacitor C4 and a FET M1. A carrier signal inductively coupled to the passive data storage device 300 is supplied via a capacitor C5 to a junction 31 between the anode of a first diode D1 and a cathode of a second diode D2. The cathode of the first diode D1 is coupled to a first power supply rail 310 (Vdd) while the anode of the second diode D2 is connected to a second power supply rail 320 (Vss). The diodes D1 and D2 provide a power supply deriver for deriving a power supply for the passive data storage device 300 from the carrier signal. It will, of course, be appreciated that, in the interests of simplicity, the power supply connections to the remaining components of the passive data storage device 300 are not shown in FIG. 12.

The remaining components of the passive data storage device consist of a control engine 330 which controls reading and writing of data to and from the memory 340. The control engine is, in this case, a state machine having its own memory. As another possibility, the control engine may be a microprocessor with associated memory.

A clock signal for the control engine 330 is derived from the carrier signal by a first signal deriver 350 in the form of a fast missing pulse detector coupled to junction J1. The control engine 330 extracts data carried by the carrier signal using the output of the first signal deriver 350 and the output of a second signal deriver 360 in the form of a slow missing pulse detector also coupled to the junction J1. A data output of the control engine 330 is coupled to a control gate of the FET M1 so that then the data is output by the control engine 330 the data switches the FET M1 and the loading across the inductor L3 varies in accordance with whether the FET M1 is conducting or non-conducting, thus causing modulation of the carrier signal with the data. Data output by the control engine 350 is extracted from the modulated carrier signal, as shown in FIG. 12, by the demodulator 28, filter 29a and buffer/squaring circuitry 29b that provides a data input signal to the controller 5. As described thus far the passive data storage device is similar to a read only passive data storage device.

In order to write data to the passive data storage device 300, the controller 5 is arranged to control the gate 27 to interrupt the carrier signal for a first time when the data bit is to be a binary "0", and to interrupt the oscillator signal for a second different time when the data bit to be transmitted is a binary "1". The time out periods of the fast and slow missing pulse detectors are set so that the output of the fast missing pulse detector will have one of two widths dependent on whether the particular data bit is a binary "0" or a binary "1" while the slow missing pulse detector will provide a pulse only when a particular data bit is a binary "1". The control engine 330 can thus determine from the outputs of the first and second signal derivers 350 and 360 whether a received bit is a binary "0" or a binary "1". The control engine 330 is arranged to recognise codes (patterns of 0s and 1s) received from the controller 5 that determines the action that should be taken by the control engine, that is whether the control engine should simply read out the data in a portion of the memory 340, should erase that data and write new data in and so on. Further details of the writing and reading operations can be found in UK Patent Application No. 0031518.4.

Where, as described above the passive data storage device can be written to, then the controller 5 may be arranged to store historical use data in the passive data storage device 300. This use data may, for example, indicate the time period for which the subsidiary body 3 was in operation and where the controller 5 has a continually running battery backed up clock, the time since the last use of the subsidiary body. This data would therefore provide a record of the historical degree and frequency of use of the subsidiary body that could be accessed for example during maintenance of the electrical appliance or to check on the user's use or routine of use of the electrical appliance.

Figure 13A:
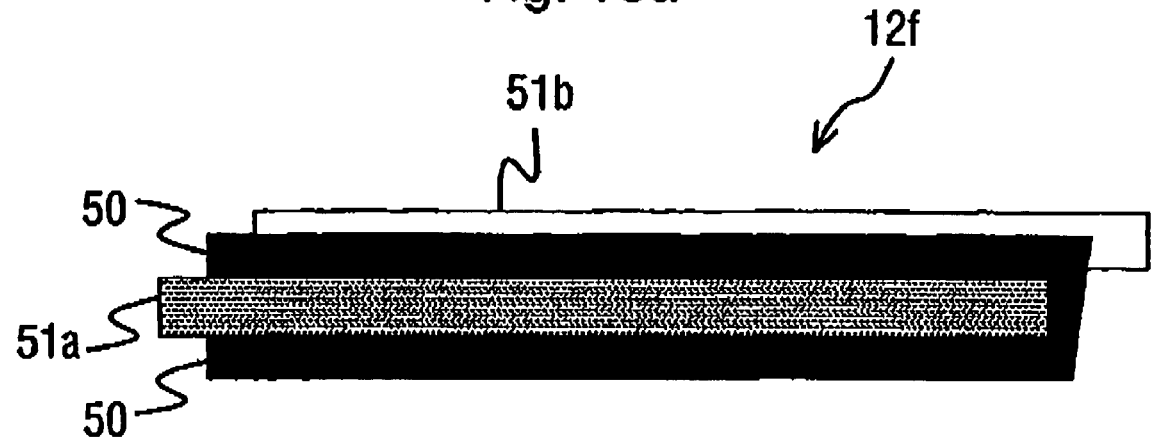
FIGS. 13a and 13b illustrate, respectively, the construction of and the equivalent circuit diagram for another example of a detectable component embodying the present invention.
Figure 13B:
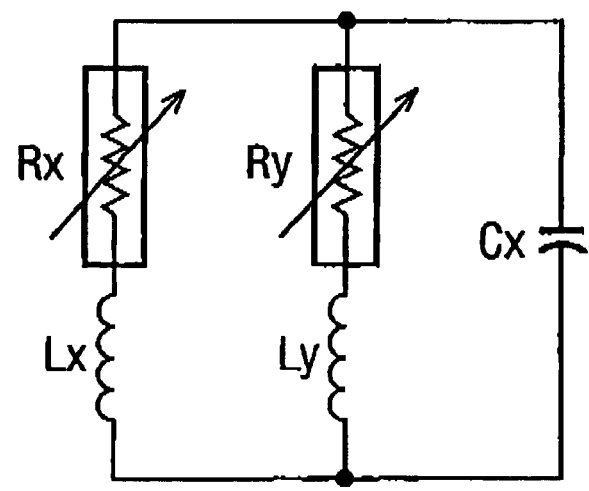

FIGS. 13a and 13b illustrate another example of a detectable component embodying the present invention. In this case, the detectable component 12f is formed as a laminated structure consisting of a dielectric material layer 50 on either side of which is provided GMI material 51, as shown in FIG. 13a, so that the GMT material layers 51a and 51b effectively form the plates of a capacitor. This structure is then wound to form an inductive configuration whose equivalent circuit is shown in FIG. 13b, that is this detectable component, in equivalent circuit terms, comprises a parallel resonant circuit consisting of two highly coupled inductors LX and LY each with a GMI series resistive component RX and RY and a parallel capacitance CX. In this case, the inductive component is formed from two tightly coupled coils LX and LY which appear effectively in parallel and, because the capacitive component CX is formed from the inter-winding capacitance, the parallel inductors combine to provide half the individual inductance value enabling a smaller amount of GMI material to be used to achieve "self-resonance" at a given frequency. Such a detectable component 12f may be used in place of the detectable component 12a shown in FIG. 4a, for example.

The present invention may be applied to other forms of electronic devices and electrical appliances having attachable components or accessories that, when fitted to the main body of the electronic device, will rotate, reciprocate, oscillate, vibrate and so on. Examples, in addition to power tools such as electric screw drivers, saws, sanders, polishing devices and so on, are medical devices such drug or other formulation delivery systems, and devices including catheters, and domestic electrical appliances such as vacuum cleaners, kitchen appliances such as food processors personal care appliances such as hair dryers, massage, skin care devices and so on, when different attachments may be provided for different functions. In the case of a medical device, the detectable component may be a disposable set or disposable accessory, a syringe or capsule carrying a specific formulation, drug or drug dose to be delivered by a delivery system and different formulations, drugs and/or doses may be provided in different uniquely identifiable detectable components so that the reader incorporated in the delivery system can identify the drug or drug dose. Where the detectable component includes a passive data storage device as described above with reference to FIG. 10, then the identity code may identify at least one of the drug identity, dose, batch code, lot number, expiry date and so on and the reader in the medical device may be arranged only to allow operation when the read drug identity, dose and/or batch/lot number is correct and any read expiry date has not passed. In addition, in the case of medical or other devices, if a detectable component is intended for single use (such as single use disposable set or accessory for a medical delivery system for example), then the reader may be arranged to allow the device to operate with a particular detectable component only when its signature and/or ID code has not previously been detected or if the detectable component is intended for a limited number of uses, only when its signature and/or ID code has previously been detected fewer than the prescribed number of times.

The subsidiary body need not necessarily comprise an attachable component but may be an accessory or object is that may be used with or associated with the main body of the electrical appliance or electronic device. For example the subsidiary body need not comprise a tool to be driven or operated by the main body but may comprise a guard, lid or the like that needs to be present to ensure safe operation of the device. In this case, the presence of the detectable component within the lid or guard and the reader in the main body would ensure that the electronic device could not be operated in the absence of the lid or guard without the need for complex mechanical and/or electrical interlocks. The detectable component may also be used as an anti-counterfeiting device and/or for brand protection.

As another possibility, the subsidiary body may be an attachment that does not rotate or otherwise move but rather affects the operation of the device, such as a hair dryer diffuser attachment that effects air flow from the hair dryer.

As a further possibility, the electronic device or electrical appliance may be or form part of a novelty item, toy or game with the subsidiary body being an attachable or detachable component, an accessory or other object such as a playing piece that is used with the main body. The present invention may also have applications for devices that communicate using a standard communications protocol such as BLUETOOTH.

As another example, the subsidiary body need not be an accessory or attachable component but could be or form part of a completely separate object whose identity or authenticity is to be determined by detection apparatus. For example the subsidiary body may be a security pass or secure document carrying the detectable component, or other form of document. The subsidiary body may also be, for example, a ticket, bank note, label, packaging material, clothing and so on.

In the embodiments described with reference to FIGS. 4a to 4d the detectable component provides a resonant circuit when coupled to the detection apparatus. This increases the range over which the detectable component can be detected. However, if close proximity of the detectable component to the detection apparatus can be arranged, for example by mechanical constraints, then the detectable component does not need to provide a resonant response when coupled to the detection apparatus.

Figure 14:
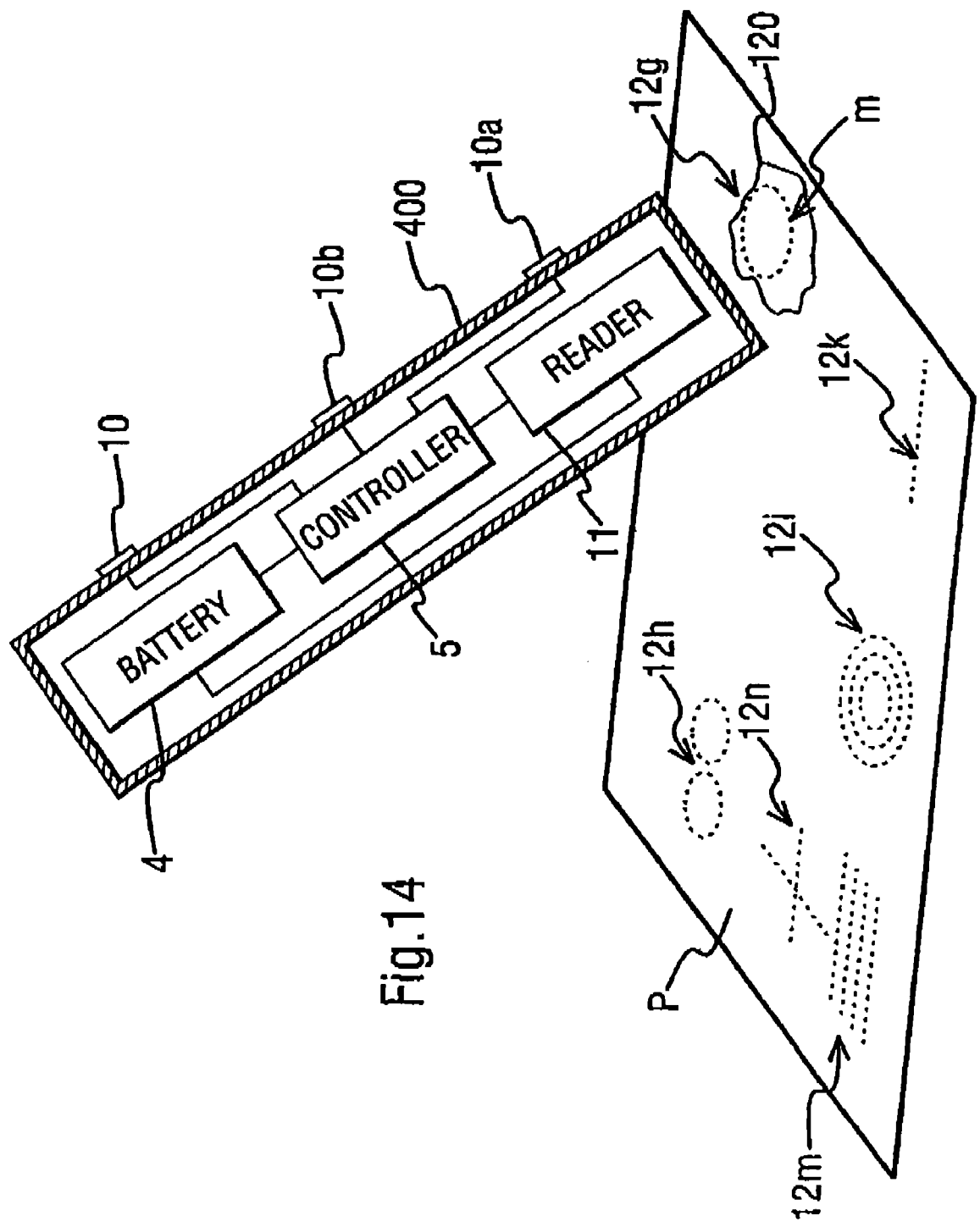
FIG. 14 shows another example of a detectable component and a detection apparatus embodying the present invention.

FIG. 14 illustrates very diagrammatically an example where the detectable component is not a resonant component. In this example, the detectable component is carried by a substrate in the form of a sheet of paper or other medium P and is detectable by detection apparatus 400.

In this example, a detectable component 12g has the form of a closed loop M of GMI material that is embedded within the substrate P during its manufacturing process and the detection apparatus 400 comprises a pan, wand or other device that can be held in the hand and that contains a reader 11 as described above with reference to FIG. 2, a battery 4, a controller 5 in the form of a microprocessor or microcontroller and associated memory and a user interface having for example an on/off switch 10, a display 10a (that may consist simply of red and green light emitting devices or may be an LCD display) and possibly also a loudspeaker 10b. In this case, the pen or wand is activated by a user using the on/off switch 10. When the user activates the pen 400, then the controller 5 activates the high frequency oscillator 20 to output continually the high frequency carrier or excitation signal to the sensing coil L1 and activates the low frequency signal generator 21 to produce low frequency pulses causing the coil L2 to create a symmetrically oscillating magnetic field. The user then sweeps the pen over the paper P and, if the paper P carries the detectable component, then its presence or not will be detected as described above with reference to FIG. 2 and in response to the detection by the reader 11, the controller 5 will cause the user to be advised whether the substrate is genuine or correct by controlling the user interface accordingly. For example a green light may be activated when the detectable component is detected or a beep emitted or a red light may be activated if no detectable component is detected or if a display is included an appropriate message may be displayed.

As described above with reference to FIG. 14, the detectable component 12g is a single loop of GMI material. FIG. 14 also shows other possibilities for the detectable component. For example, a detectable component 12h may be provided that consists of two or more loops, rings or discs that may be positioned adjacent as shown, overlapping or on top of one another. The two or more loops, rings or discs may have different characteristics so that, together, they provide a more complex signature. Also, a number of loops, rings or discs may be provided to enable provision of a code, for example the detectable component 12i consists of a number of concentric circles, each of which may be detected individually by the reader with, for example, the relative spacing of the concentric circles defining the code. As another possibility, the detectable component may comprise, as shown at 12k in FIG. 14, a single strip or, as shown at 12m, a series of strips that may form a bar code, for example. Such a bar code may also be formed by deactivating or masking (for example with mumetal) parts of a GMI material element. Where the detectable component is a strip or has another directional shape, then generally relatively precise alignment of the reader and detectable component will be required in order for the reader to detect the detectable component. Such directionality effects may be reduced by providing the detectable component as two detectable elements located at right angles to one another as shown for the detectable element 12n in FIG. 14. As another possibility, such directionality may also form part of the characteristic of the detectable component and the reader may be modified to incorporate a rotating magnetic field generator to enable a coded detectable component having several different GMI material elements radiating out from a common centre at defined angles relative to one another.

As described above, the detectable component may be embedded within or carried on the substrate. The detectable component may also be hidden within or beneath another component embedded in the substrate, or between layers of a laminated substrate. As another possibility the detectable component may be embedded or mounted within a plastics material, for example a thermoplastic or thermosetting moulding. This would enable the detectable component to be embedded in a plastics material part or accessory, for example the detectable component could be embedded in a connector or mechanical coupling, such as a slide valve, that couples or interlocks with a part of another body to couple or interlock an accessory or disposable component to said other body. In this case, the other body may carry the detection apparatus. The connector or mechanical coupling may be integral with the accessory or may be coupled to the accessory by a similar coupling or interlocking mechanism. This would have the advantage that the coupling or interlocking should enable precise location of the embedded component with respect to the detection apparatus simply by the correct fitting of the coupling or connector to the said other body. One example of such an application is in a disposable set (which generally consist of tubing and a drip bag holding the formulation to be delivered to a patient) for a medical delivery device where the detectable component may be embedded in the coupling or connector that connects the disposable set tubing to a pump (generally a peristaltic pump) to allow delivery via an outlet tube to a catheter or intravenous needle for insertion into a patient to enable delivery of the formulation to the patient. In this case the detection apparatus would be incorporated in or carried by the pump housing.

As another example, the detectable component may, as shown schematically by the area 120 in FIG. 14, be hidden beneath or within a printed area on the substrate, for example embedded in a paper or cardboard substrate.

For example, the detectable component may be provided under an area of black printing such as under the amount box or cross lines of a banker's cheque, or under or within a bar code, other code or item of printing or under or within a covert code of the type described in our copending International Patent Application No. GB02/003549, the whole contents of which are hereby incorporated by reference. As a another possibility, the detectable component may hidden behind, incorporated within or form an intrinsic part of a foil hologram which would look like a conventional security hologram but could also be verified magnetically because of the presence of the detectable component. In this case, the foil area should be sufficient to load the sensing coil signal to generate an invalid detection signal unless the detectable component is also present. As a further possibility, the detectable component (or a portion thereof) may be visible and may be coloured. In this case, the colouring may be used as a secondary security feature, for example a reader may be arranged only to detect detectable components when an optical detector forming part of the reader also detects the correct colour detectable component. As a further possibility, the detectable component may incorporate a fluorescent material, for example a fluorescent ink, and the reader may be arranged to detect that specific fluorescence as a secondary security feature or as a third security feature if the detectable component has a colour or has a coloured portion that can be detected by the reader separately from the fluorescence. The detectable component may have two or more specific different colours (or two or more specific different, colour portions) and/or two or more different fluorescence wavelengths and the reader may be designed to detect specific colour and/or fluorescence combinations to provide added security.

A detectable component as described above may be used for brand protection applications by embedding the detectable component in, for example, product packaging such as for example a cigarette packet, a medicine packet or box and so on.

Figure 16:
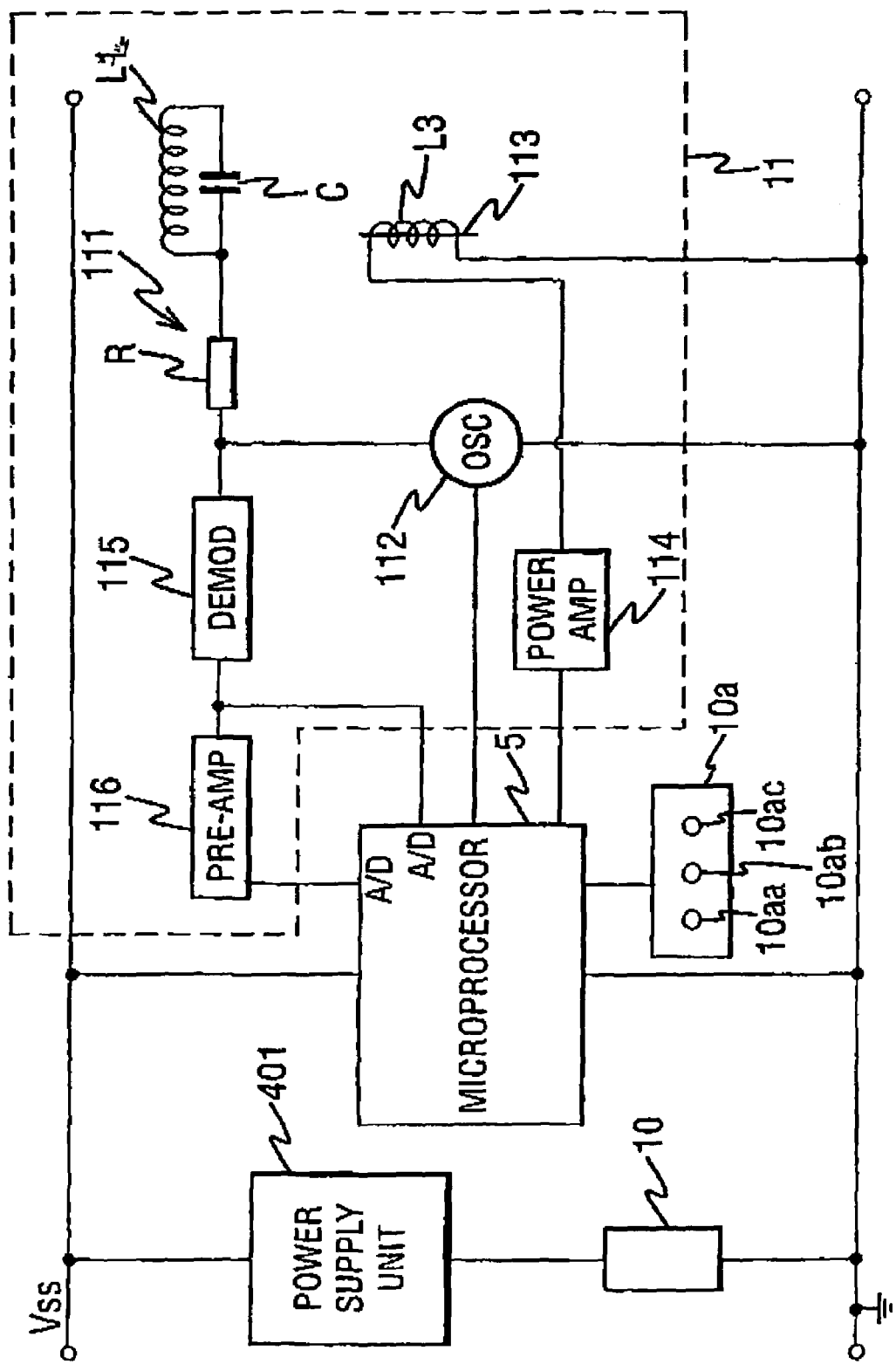
FIG. 16 shows a functional block diagram illustrating one form of the detection apparatus shown in FIG. 14.

FIG. 16 shows a functional block diagram illustrating in greater detail one form that the detection apparatus 400 shown in FIG. 14 may take while FIG. 17 shows a schematic representation of one form of coil assembly that may be used in the reader 11 of the detection apparatus 400.

As shown in FIG. 16, the controller 5 and reader 11 are coupled to a power supply unit 401 (which will generally include a battery 4 as shown in FIG. 14) via the switch 10 (n the interests of simplicity, not all connections to the power supply unit are shown in FIG. 16). In this case the reader is a microprocessor-based reader, that is the controller 5 is a microprocessor. However, an ASIC (Application Specific Integrated Circuit) may be used to reduce costs.

The reader 11 has a tuned circuit sensing coil arrangement 111 (comprising a sensing coil L1 and coupled in parallel with a capacitor C and in series with a resistor R) arranged to be driven by an oscillator 112 under the control of the microprocessor 5. A modulating coil L3 wound on a ferrite rod or core 113 is located within and at right angles to the sensing coil L1. The microprocessor 5 is arranged to generate a low frequency modulating field signal at around 500 Hz as an approximate sine wave which is filtered and amplified by a power amplifier 114 before being supplied to drive the modulating coil.

FIG. 17 shows a plan view of one example of a coil assembly 110 that may be used in the reader shown in FIG. 16. The coil assembly 110 comprises the sensing coil L1, modulating coil L3 and ferrite core 113 with the modulating coil within and at right angles to the sensing coil as discussed above. Typically, the coil assembly 110 is provided on a 30 mm by 20 mm PCB (Printed Circuit Board) with the sensing coil being a PCB track. The sensing coil L1 could, however, be formed of Litz wire as discussed above which would improve the Q of the circuit. The ferrite core 113 is provided to "focus" the modulating magnetic field lines along the length of the GMT material strip of a detectable component such as the detectable component 12k or 12 shown in FIG. 14.

As the modulating field coil L3 and the ferrite core 113 are at right angles to the sensing coil L1, there is very little cross-talk between these parts of the coil assembly (provided that the modulating coil L3 and ferrite core 113 are wholly within the sensing coil L1) and so, as explained above with reference to FIG. 2 a frequency doubler is not required and a simple phase-locked amplitude demodulator can be used. Thus, in this example, the reader 11 has an amplitude demodulator (DEMOD) its which is phase-locked to the modulating field and is arranged to detect amplitude modulation of the sensing coil L1 signal resulting from the presence of a detectable component. The detected modulation is supplied via a pre-amplifier 116 to an A/D (analogue-to-digital) conversion circuit within the microprocessor 5. A DC level signal may also be provided to the microprocessor 5 by supplying the output of the demodulator 115 to another A/D (analogue-to-digital) conversion circuit of the microprocessor 5.

In this example, the microprocessor 5 is arranged to control a display 10a having a yellow LED 10aa for indicating that the reader has tried to read a detectable component but failed, a green LED 10ab for indicating that the reader has read a detectable component and detected a detectable component and a red LED 10ac for indicating that the reader has tried to read a detectable component and has detected a false signal. In this case, no loudspeaker is provided. Of course, other forms of display, for example an LCD display or a character display may be provided and audible rather than, or in addition to, visual signals may be provided.

In operation of the detection apparatus 400 shown by FIGS. 16 and 17, when a user activates the switch 10, the microprocessor 5 activates the oscillator 112 so that the sensing coil L1 provides the 13.56 MHz signal and also supplies the modulating drive signal to the modulating coil L3 via the power amplifier. The demodulator 115 is phase-locked to the frequency of the modulating signal and detects amplitude modulation of the sensing coil L1 signal resulting from changes in the resistance of a detectable component due to the presence of the modulating field provided by the modulating coil L3. The detected signal is amplified by the pre-amplifier 116 and supplied to the microprocessor for analogue to digital conversion and comparison with the original modulating signal. If the microprocessor 5 determines that the two signals correspond (as described above, the modulation of the RF signal resulting from the presence of a valid or correct marker will have a frequency twice that of the modulating coil L3 field frequency because the magnetic properties of the GMI material are dependent primarily on field strength and not on field polarity) and concludes therefore that the modulation of the RF signal resulted from the modulating field generated by the modulating coil L3, then the microprocessor 5 causes, in this example, the green LED 10ab to be illuminated. If no modulation is detected, then the microprocessor 5 causes the yellow LED 10aa to be illuminated whereas if a modulation is detected that fails the comparison test, then the microprocessor 5 causes the red LED 10ac to be illuminated. The microprocessor 5 may use the signal supplied directly from the demodulator 115, after analogue to digital conversion, to identify the presence close by of a large conductor because this will "load" the sensing coil field so that the DC signal level falls significantly below that which should have been seen. In this latter case, the microprocessor 5 lights the red LED 10ac.

The microprocessor 5 may also light the red LED 10ac if a signal that is out of phase with the original modulating field is detected or the loading of the sensing coil L1 exceeds that which would be expected for the given volume of material in the detectable component.

In above-described examples, the detection apparatus may be provided in a device that the user scans across the subsidiary object such as a paper or other substrate P. As another possibility, the detection apparatus may be provided in a device, such as a ticket reader, that is affixed to a surface and the subsidiary object moved or scanned relative to that device.

As a further possibility, one of the detection apparatus and the detectable component may be embedded in or carried by one part of a mechanical coupling and the other by a second part of a mechanical coupling (such as a plug and socket) or a part associated with that second part (such as the pump or pump housing in the case of medical delivery device described above).

Figure 15:
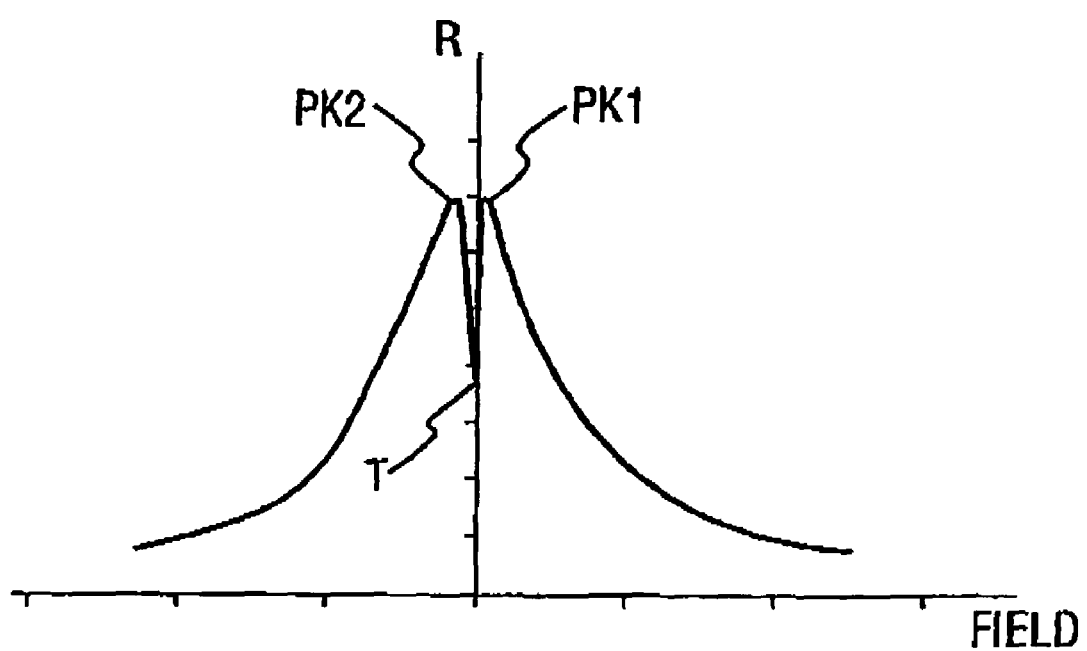
FIG. 15 shows a graph of impedance against magnetic field for a material exhibiting the giant magneto impedance (GMI) effect.

FIG. 15 shows a graph of resistance (R) against magnetic field strength B in Teslas for a GMI resistive component showing the effect of the magnetic field caused by the low frequency signal generator 21 in FIG. 2 when the GMI material is subject to the high frequency signal generated by the oscillator 20. As can been seen, the graph has a characteristic profile with two peaks PK1 and PK2 disposed on opposite sides of the B=0 line or y-axis and separated by a trough T. All of these three significant knee points may be exploited to enable detection of a detectable component incorporating GMI material. Thus, although it is not necessary for the varying applied magnetic field to change polarity, it, as described above, the applied magnetic field does vary in polarity, then the GMI material will show a frequency doubling effect. (Of course, where the frequency doubling effect is not present, then the frequency doubler 22 shown in FIG. 2 will not be required.) A frequency doubling or phase shift may also be detected if the variation in the applied magnetic field is centred about one of the knee points. Other features of the characteristic profile may also be used by the reader to detect the GMI material.

At least one of the sensing and modulating coils may be arranged to provide a variable frequency signal. Thus, the oscillators may be configured to provide a variable frequency output signal, for example one or both of the oscillators 20 and 21 or 112 may be a variable frequency oscillator (for example a voltage controlled or numerically controlled (VCO or NCO) oscillator) having a frequency controllable by the controller or microprocessor 5 (or a separate controller in the reader). In this case, the controller or microprocessor 5 may be configured to control the oscillator to select or vary the frequency and the controller or microprocessor 5 may be configured to cause the magnetic field to sweep through the range shown in FIG. 15 to enable data to be obtained representing the characteristic profile which the controller or microprocessor 5 may then compare with data stored in its memory representing the expected profile so enabling the controller or microprocessor 5 to determine with great certainty whether or not a detectable component is present.

The above description assumes that all GMI resistive components will have the same effect on the reader 11 (that is they will all have the same "signature") so that only the presence or absence of the detectable component can be determined. This need not necessarily be the case and a detectable component having GMI resistive components with different, uniquely identifiable signatures may be provided. This may be achieved by manufacturing the different GMI resistive components under different manufacturing characteristics and or with different compositions because, as described in the aforementioned paper by LV Panina and H Mohri, the field strengths response of the GMI resistive component may be changed by varying its composition or manufacturing conditions. In this case, a particular reader may be arranged to detect a particular unique signature (by comparing detected signature with pre-stored data) or may be arranged to detect a number of different signatures of different detectable components by comparing a detection signal that is unique to a particular detectable component with data stored in its memory relating to that feature. For where, where the oscillator 21 is a variable frequency oscillator (for example a voltage controlled or numerically controlled (VCO or NCO) oscillator) the controller 5 may control the oscillator so that, during the detection process, the high frequency oscillator 21 sweeps over a frequency range enabling the controller to determine the particular "signature" or characteristic (resistance against magnetic field strength as shown in FIG. 15) of the detectable component and thus compare it with data in it memory representing the signatures of different detectable components so that the reader can distinguish one detectable component from another by detecting the different frequency responses. As another possibility, the controller may cause the applied magnetic field to change to enable identification of the signature by detecting the response to different magnetic field strengths (that is by detecting the impedance response). Different signatures may also be provided by combining a detectable component with a metal foil element (formed of a non-magnetic metal conductor such as, for example, aluminium or copper) with one being positioned over or adjacent or overlapping the other, and detecting the combined signature by scanning using a magnetic field of varying strength and polarity.

The controller 5 may be configured to vary at least one of the frequency, field strength and polarity of at least one of the sensing and modulating coils to enable different signatures to be read or detected.

The GMI resistive component may be provided with a bias flux from a fixed magnet or electromagnet that may form part of the detection apparatus. In this case, because of the bias, the magnetic field experienced by the subsidiary body 3 will not be a symmetrically oscillating magnetic field even if the low frequency carrier signal frequency 21 provides a symmetrically oscillating signal.

The response (shown schematically in FIG. 15) of the GMI resistive component may also be biased by incorporating a permanent magnet into the detectable component so that the GMI resistive component is subject to a magnetic field consisting of the combination of the varying magnetic field applied by the reader and the magnetic field generated by the permanent magnet and the controller programmed so as to enable this magnetic field bias (and thus different detectable components having different strength permanent magnets) to be distinguished from one another. The skin resistance of the GMI resistive component can also be changed by changing the cross-sectional shape or dimensions of the wire or ribbon of GMI material, for example the diameter of the wire. These effects may be combined increasing the range of uniquely identifiable detectable components, that is the number of detectable components having different "signatures". A signature may vary in dependence on, for example, RF sensing coil or excitation frequency, modulating field strength and frequency, chemical formula or composition.

Different composition GMI materials may be detectable by superimposing a DC magnetic field component or bias on the modulation coil field (to bias the signature shown schematically in FIG. 15). The microprocessor may then extract the signature of the particular GMI material and compare it with signature data stored in memory. Different signatures may also be achieved with different shapes of GMI material detectable components. Also, as described above, codes may be achieved by different patterns, shapes or positions of the GMI resistive component.

Any combination of the above mentioned features may be used to provide a number of different detectable components each with a different unique signature and the reader may be configured as described above to enable detection of a unique one or two or more of the different signature detectable components.

In the above described examples, a modulating field providing coil or magnet is provided. Where the reader incorporates or is provided in another product having a loudspeaker or similar component providing a varying magnetic field of an appropriate frequency, then this may be used as the modulating field provider so that the coil L2 or L3 or magnet 30 can be omitted. Of course, it would still be necessary for the microprocessor 5 to be able to compare the magnetic field drive signal and the sensed signal to determine if the detectable component is present.

The reader shown in FIGS. 16 and 17 may be used in the electrical appliance shown in FIG. 1 or with the detectable components shown in FIGS. 4 to 19. The coil assembly shown in FIG. 17 could be used in the reader shown in FIG. 2 (in which case the frequency doubler would not be necessary) or in the reader shown in FIG. 3.

As a further example, the detectable component shown in FIG. 4a may be modified by omitting the loop M and forming the open circuit coil of a low ohmic wire that has GMI properties. The GMI wire itself may be formed so as to be multi-stranded, like Litz wire, by bundling a number of insulated (for example glass-coated) GMI wires or strands together and then winding the bundle to form the coil. Also, the strands of the GMI wire may be annealed to provide different signatures. As another possibility the bundles may be made up of strands having different GMI signatures and different combinations of strands may be used to provide different bundles with different signatures.

The invention claimed is:

1. A detectable component, comprising;
   a first inductive component adapted to couple inductively to a second inductive component of a detection apparatus when the detectable component is in range of or coupled to the detection apparatus; and
   a resistive component comprising a closed loop inductively coupled to the first inductive component, wherein the resistive component has a resistance that varies with magnetic field to cause modulation of a carrier signal supplied to the second inductive component of the detection apparatus,
   wherein the detectable component has a characteristic signature that enables the detectable component to be distinguished by the detection apparatus from other detectable components having different characteristic signatures.

2. A detectable component according to claim 1, wherein the characteristic signature is provided at least partly by the manner in which the resistance of the resistive component varies with magnetic field.

3. A detectable component according to claim 2, wherein the composition of the material is different from that of other detectable components having differing characteristic signatures.

4. A detectable component according to claim 1, wherein the resistive component comprises a material exhibiting Giant Magneto-Impedance (GMI).

5. A detectable component according to claim 1, wherein the detectable component also includes a passive data storage device that at least partly provides the characteristic signature to enable the detectable component to be distinguished by the detection apparatus from other detectable components having different characteristic signatures.

6. A detectable component according to claim 5, wherein the passive storage device comprises a radio frequency identification (RFID) tag.

7. A detectable component according to claim 6, wherein the RFID tag comprises a readable RFID tag.

8. A detectable component according to claim 6, wherein the RFID tag comprises a writeable RFID tag.

9. A detectable component according to claim 1, further comprising an optically detectable element that at least partly provides the characteristic signature to enable the detectable component to be distinguished by the detection apparatus from other detectable components having different characteristic signatures.

10. A detectable component according to claim 9, wherein the optically detectable element comprises a color of at least a region of the detectable component.

11. A detectable component according to claim 9, wherein the optically detectable element comprises a fluorescent region of the detectable component.

12. A detectable component according to claim 1, wherein the characteristic signature is provided at least partly by a magnetic biasing element.

13. A detectable component according to claim 1, wherein the characteristic signature is provided at least partly by at least one of the size and shape of the resistive component.

14. A detectable component according to claim 1, wherein the resistive component defines a code.

15. A detectable component according to claim 14, wherein the resistive component defines a bar code.

16. A detectable component according claim 1, wherein the resistive component is associated with a metallic member.

17. A detectable component according to claim 1, wherein the resistive component is associated with a foil hologram carried by the detectable component.

18. A detectable component according to claim 1, wherein the detectable component is included in a subsidiary body for use with an electronic device or electrical appliance.

19. A detectable component according to claim 1, wherein the detectable component is included in a tool attachable to an electronic device or electrical appliance.

20. A detectable component in accordance with claim 1, wherein the detectable component is included on a substrate.

21. A detectable component in accordance with claim 1, wherein the detectable component is included in a sheet of paper.

22. A detectable component in accordance with claim 1, wherein the detectable component is included in at least one of an accessory, attachment and disposable component.

23. A detectable component in accordance with claim 22, wherein the detectable component is included in a tool.

24. A detectable component in accordance with claim 22, wherein the detectable component is included in a disposable accessory attachable to a medical device.

25. A detectable component, comprising:
a first inductive component adapted to couple inductively to a second inductive component of a detection apparatus when the detectable component is in range of or coupled to the detection apparatus, wherein the first inductive component comprises a plurality of electrically conductive paths coupled in parallel; and
a resistive component with a resistance that varies with magnetic field to cause modulation of a carrier signal supplied to the second inductive component of the detection apparatus, wherein the resistive component comprises a closed loop inductively coupled to the inductive component.

26. A detectable component according to claim 25, wherein the first inductive component is a coil of Litz wire.

27. A detectable component according to claim 25, wherein the first inductive component comprises an open-circuit coil.

28. A detectable component according to claim 25, wherein the first inductive component comprises a coil and the resistive component provides a resistive path along a magnetic flux line.

29. A detectable component according to claim 25, wherein the first inductive component also includes a capacitor.

30. A detectable component according to claim 25, wherein the resistive component has a skin resistance that varies with magnetic field.

31. A detectable component according to claim 25, wherein the resistive component comprises a material exhibiting Giant Magneto-impedance (GMI).

32. A detectable component according to claim 31, wherein the resistive component comprises a cobalt alloy.

33. A detectable component according to claim 25, wherein the first inductive component is a tuned circuit.

34. A detectable component according to claim 25, further comprising a passive device operable, when the detectable component is coupled to or is in range of the detection apparatus, to derive power from a carrier signal supplied by the detection apparatus and to communicate with the detection apparatus.

35. A detectable component according to claim 34, wherein the passive data storage device includes a memory storing data and is operable, when powered, to modulate the carrier signal in accordance with data read out from the memory.

36. A detectable component according to claim 35, wherein the passive data storage device is a writeable passive data storage device.

37. A detectable component according to claim 34, wherein the passive device comprises a radio frequency identification (RFID) tag.

38. A detectable component according to claim 37, wherein the RFID tag comprises a readable RFID tag.

39. A detectable component according to claim 37, wherein the RFID tag comprises a writeable RFID tag.

40. A detectable component according to claim 25, further comprising a passive device operable, when the first and second inductive components are coupled, to derive power from the carrier signal and to communicate with the detection apparatus.

41. A detectable component according to claim 25, also incorporating a permanent magnetic element.

42. A set of detectable components each according to claim 25, each detectable component having a resistance that varies with magnetic field when the detectable component is subjected to an excitation field, each of the detectable components having a different resistance characteristic so providing each detectable component with a different identification signal.

43. A detectable component, comprising:
a first inductive component adapted to couple inductively to a second inductive component of a detection apparatus when the detectable component is mechanically coupled to the detection apparatus, wherein the first inductive component consists solely of a coil formed of a material having a resistance that varies with magnetic field to cause modulation of a carrier signal supplied to the second inductive component component of the detection apparatus.

44. A detectable component according to claim 43, wherein the coil is formed of a material exhibiting Giant Magneto-Impedance (GMI).

45. A detectable component according to claim 44, wherein the coil comprises a cobalt alloy.

46. A detectable component according to claim 43, wherein the coil is a single closed loop.

47. A detectable component, comprising:
first inductive coupling means adapted to couple inductively to second inductive coupling means of a detection apparatus when the detectable component is mechanically coupled to the detection apparatus, the mechanical coupling causing the first inductive coupling means and the second inductive coupling means to effectively form a primary and secondary of a transformer, the first inductive coupling means comprising a resistive component with a resistance that varies with magnetic field to cause modulation of a carrier signal supplied to the second inductive coupling means of the detection apparatus, the detectable component having a characteristic signature that enables the detectable component to be distinguished by the detection apparatus from other detectable components having different characteristic signatures.

48. A detectable component according to claim 47, wherein the detectable component also carries a passive data storage device that at least partly provides the characteristic signature to enable the detectable component to be distinguished by the detection apparatus from other detectable components having different characteristic signatures.

49. A detectable component according to claim 47, further comprising an optically detectable element that at least partly provides the characteristic signature to enable the detectable component to be distinguished by the detection apparatus from other detectable components having different characteristic signatures.

50. A detectable component according to claim 49, wherein the optically detectable element comprises a color of at least a region of the detectable component.

51. A detectable component according to claim 49, wherein the optically detectable element comprises a fluorescent region of the detectable component.

52. A detectable component according to claim 47, wherein the characteristic signature is provided at least partly by a magnetic biasing element.

53. A detectable component according to claim 47, wherein the characteristic signature is provided at least partly by at least one of the size and shape of the resistive component.

54. A detectable component according to claim 47, wherein the characteristic signature is provided at least partly by the shape of the resistive component which is selected from a loop, ring or disc, cross, and bar.

55. A detectable component according to claim 47, wherein the first inductive coupling means comprises a coil of Litz wire.

56. A detectable component according to claim 47, wherein the resistive component comprises a resistive element coupled in series with an inductive component.

57. A detectable component according to claim 47, wherein the resistive component comprises a coil also forming an inductive component.

58. A detectable component according to claim 47, wherein the resistive component comprises a closed loop inductively coupled to an inductive component.

59. A detectable component according to claim 47, wherein the first inductive coupling means comprises an open-circuit coil.

* * * * *